(12) United States Patent
Tanabe et al.

(10) Patent No.: US 6,902,102 B2
(45) Date of Patent: Jun. 7, 2005

(54) SOLDERING METHOD AND SOLDER JOINT MEMBER

(75) Inventors: Kazuhiko Tanabe, Kawasaki (JP); Hiroaki Terada, Toyama (JP); Masahiro Sugiura, Nagoya (JP); Tetsuharu Mizutani, Kasugai (JP); Keiichiro Imamura, Yokohama (JP); Takashi Tanaka, Osaka (JP)

(73) Assignees: NEC Infrontia Corporation, Kanagawa (JP); NEC Toppan Circuit Solutions Toyama, Inc., Toyama (JP); Soldercoast Co., Ltd., Aichi (JP); Maruya Seisakusho Co., Ltd., Aichi (JP); Nihon Den-netsu Keiki Co., Ltd., Tokyo (JP)

( * ) Notice: Subject to any disclaimer, the term of this patent is extended or adjusted under 35 U.S.C. 154(b) by 79 days.

(21) Appl. No.: 10/339,643

(22) Filed: Jan. 10, 2003

(65) Prior Publication Data

US 2003/0168499 A1 Sep. 11, 2003

(30) Foreign Application Priority Data

Jan. 11, 2002 (JP) .......................... 2002-004185
Mar. 13, 2002 (JP) .......................... 2002-067870
Sep. 27, 2002 (JP) .......................... 2002-282704

(51) Int. Cl.[7] .......................... B23K 1/20; B23K 35/363
(52) U.S. Cl. .................. 228/260; 228/180.1; 228/223; 228/214
(58) Field of Search ................. 228/260, 180.1–180.21, 228/214, 224, 223, 254, 259, 37, 36; 427/96, 98, 304, 405; 148/26, 23, 24, 25

(56) References Cited

U.S. PATENT DOCUMENTS

| 5,698,160 | A | * | 12/1997 | Chen et al. .................. 420/557 |
| 5,716,663 | A | * | 2/1998 | Capote et al. ................ 427/96 |
| 5,863,355 | A | * | 1/1999 | Ohno et al. ................... 148/26 |
| 5,955,141 | A | * | 9/1999 | Soutar et al. ................ 427/98 |
| 6,066,197 | A | * | 5/2000 | Bristol et al. ............ 106/14.42 |
| 6,457,632 | B1 | * | 10/2002 | Teshima et al. ............ 228/246 |
| 6,592,020 | B1 | * | 7/2003 | Currie et al. ............... 228/224 |
| 2003/0089617 | A1 | * | 5/2003 | Chen .......................... 205/252 |

FOREIGN PATENT DOCUMENTS

| JP | 2001-168513 A | 6/2001 |
| JP | 2001-293559 A | 10/2001 |
| JP | 2001-358456 A | 12/2001 |

OTHER PUBLICATIONS

SMT Lift–off Phenomenon on Lead–Free Solder, Proceedings of the 15th JIEP Annual Meeting, (Mar. 2001) pp. 309–310.

* cited by examiner

Primary Examiner—Jonathan Johnson
(74) Attorney, Agent, or Firm—Foley & Lardner LLP

(57) ABSTRACT

In a soldering method for soldering an electronic component including a palladium or palladium alloy layer formed on a surface of the electronic component and also including a soldering lead terminal onto a printed wiring board including a soldering land and plated through hole, a solder layer containing tin and zinc as main components is formed on the surfaces of the land through hole by a HAL treatment. The lead terminal is inserted and mounted in the through hole. The printed wiring board is brought into contact with jet flows of a solder containing tin and zinc as the main components to thereby supply a solder to the land and through hole.

8 Claims, 21 Drawing Sheets

| SURFACE OF PORTION TO BE SOLDERED | | TYPE OF SOLDER | | | |
|---|---|---|---|---|---|
| LEAD | LAND AND THROUGH HOLE | Sn-37Pb | Sn-3Ag-0.5Cu | Sn-0.7Cu | Sn-9Zn |
| Sn-37Pb | Cu | ○ | ○ | ○ | ○ |
| Au | | ○ | ○ | ○ | ○ |
| Ni/Pd | | × | × | × | △ |
| Sn-37Pb | Sn-37Pb | ○ | ○ | ○ | ○ |
| Au | | ○ | ○ | ○ | ○ |
| Ni/Pd | | × | × | × | △ |
| Sn-37Pb | Sn-9Zn | ○ | ○ | ○ | ○ |
| Au | | ○ | ○ | ○ | ○ |
| Ni/Pd | | × | × | × | ○ |
| Sn-37Pb | Sn-9Zn + ANTIRUST MATERIAL | ○ | ○ | ○ | ○ |
| Au | | ○ | ○ | ○ | ○ |
| Ni/Pd | | × | × | × | ○ |

RELATION BETWEEN SOLDERING METHOD AND FILLET PEEL

| SOLDER | COMPONENT | | REFLOW SOLDERING ONLY ON FIRST SURFACE | FIRST SURFACE REFLOW SOLDERING/ SECOND-SURFACE FLOW SOLDERING | |
|---|---|---|---|---|---|
| | SPECIFICATION | PLATING | | USUAL STATE (NO TAPE) | HEAT INSULATION TAPED |
| Sn-37Pb | 240Pin QFP | Sn-Pb | ○ | ○ | ○ |
| Sn-3Ag-0.5Cu | 240Pin QFP | Sn-Pb | ○ | × | ○ |
| | | Sn-Bi | ○ | ○ | ○ |
| Sn-3.5Ag-0.75Cu | 240Pin QFP | Sn-Pb | ○ | × | ○ |
| | | Sn-Bi | ○ | ○ | ○ |

{ ○ INDICATES NO FILLET
× INDICATES OCCURRENCE OF FILLET PEEL }

{ REFLOW TEMPERATURE 230 °C
FLOW SOLDER TEMPERATURE 250 °C }

FIG. 15A

TEMPERATURE RISE OF FIRST-SURFACE EACH PORTION DURING SECOND SURFACE FLOW SOLDERING

| CONDITIONS / TEMPERATURE MEASUREMENT PORTION | PRESENCE/ABSENCE OF HEAT INSULATION TAPE | |
|---|---|---|
| | USUAL STATE (NO TAPE) | HEAT INSULATION TAPED |
| 240PinQFP LEAD TERMINAL PORTION | 182°C | 122°C |
| PRINTED WIRING BOARD FIRST SURFACE | 201°C | 133°C |

TEMPERATURE 250°C OF FLOW SOLDER

FIG. 15B

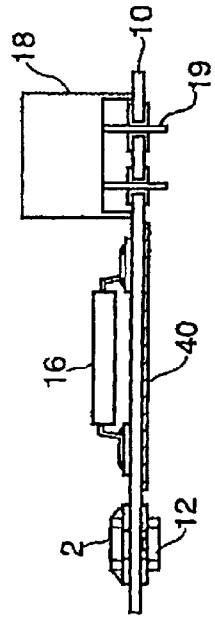

TAPED STATE

RELATION BETWEEN FLOW SOLDER BY Sn-9Zn SOLDER AND FILLET PEEL

○ INDICATES NO FILLET PEEL
× INDICATES OCCURRENCE OF FILLET PEEL

| TYPE OF SOLDER FOR REFLOW | COMPONENT | | REFLOW SOLDERING ON FIRST SURFACE (230°C) | FLOW SOLDERING OF SECOND SURFACE WITH Sn-9Zn SOLDER | |
|---|---|---|---|---|---|
| | SPECIFICATION | PLATING | | SOLDER TEMPERATURE 220°C | SOLDER TEMPERATURE 230°C |
| Sn-3Ag-0.5Cu | 240PinQFP | Sn-Pb | ○ | ○ | ○ |
| | | Sn-Bi | ○ | ○ | ○ |
| Sn-3.5Ag-0.75Cu | 240PinQFP | Sn-Pb | ○ | ○ | ○ |
| | | Sn-Bi | ○ | ○ | ○ |

REFLOW TEMPERATURE 230°C

FIG. 16B

TEMPERATURE RISE OF FIRST-SURFACE EACH PORTION DURING FLOW SOLDERING BY Sn-9Zn SOLDER

| CONDITIONS OF FLOW SOLDER | TYPES OF SOLDER | | | | |
|---|---|---|---|---|---|
| | Sn-9Zn | | | | Sn-37Pb or Sn-3Ag-0.5Cu or Sn-3.5Ag-0.75Cu |
| TEMPERATURE MEASUREMENT PORTION | TEMPERATURE OF FLOW SOLDER | | | | |
| | 220°C | 230°C | | | 250°C |
| PRINTED WIRING BOARD FIRST SURFACE | 185°C | 198°C | | | — |
| 240Pin QFP PACKAGE BODY | 136°C | 145°C | | | — |
| 240Pin QFP LEAD TERMINAL PORTION | 151°C | 160°C | | | 182°C |

| SURFACE TREATMENT | Sn-0.75Cu | 100Sn | Sn-3Ag-0.5Cu | Sn-3.5Ag |
|---|---|---|---|---|
| SPREAD STATE | | | | |
| SPREAD RATIO | 91.40% | 90.93% | 90.30% | 89.41% |

| SURFACE TREATMENT | Sn-35Ag-0.75Cu | 100Cu | Sn-37Pb |
|---|---|---|---|
| SPREAD STATE | | | |
| SPREAD RATIO | 89.28% | 82.29% | 90.18% |

| SURFACE OF LEAD TERMINAL | LAND AND THROUGH HOLE SURFACE OF PRINTED WIRING BOARD | | | | | | |
|---|---|---|---|---|---|---|---|
| | Sn100 | Sn-1.2Ag-0.75Cu | Sn-3Ag-0.5Cu | Sn-3.5Ag-0.8Cu | Sn-9Zn | 100Cu | Ni/Au |
| Sn-Pb | ○ | ○ | ○ | ○ | ○ | ○ | ○ |
| Ni/Pd | ○ | ○ | ○ | ○ | ○ | × | × |

USED SOLDER: Sn-9Zn SOLDER
SOLDER TEMPERATURE: 220°C

SOLDERING METHOD AND SOLDER JOINT MEMBER

BACKGROUND OF THE INVENTION

1. Field of the Invention

The present invention relates to soldering method of an electronic component of a soldered lead terminal plated with a lead-free metal, and a solder joint member.

Moreover, the present invention relates to a soldering method for soldering a printed wiring board including portions to be soldered in opposite surfaces, comprising: reflow-soldering one surface; and subsequently flow-soldering the other surface. The present invention particularly relates to a soldering method for performing a soldering operation in the above-described procedure, in which a fillet peel (circuit disconnection) is prevented from being generated in the reflow-soldered portion upon the flow-soldering.

Further, the present invention relates to a flow soldering method by a tin-zinc solder (solder mainly containing tin and zinc) which is superior in solder wetting/spreading and solder wetting/rising in a plated through hole even at a low temperature.

2. Description of the Related Art (First Related Art)

As a substitute for plating by a lead-containing solder, a palladium or a palladium alloy layer has been formed on a lead frame surface of a semiconductor component, However, palladium has a problem that wettability is bad with respect to the tin-lead solder heretofore used, or potential candidates of a lead-free solder, such as a tin-silver-copper based solder and tin-copper based solder. There is also a lift-off problem that the solder floats from a copper land of the printed wiring board. Such related art and problems will be described hereinafter in detail.

As described above, as a technique for the lead-free electronic component, a method of forming the palladium or palladium alloy layer on the surface of the lead frame of the semiconductor component by plating has been performed. This is because palladium is superior in wettability with respect to a bonding wire of a wax material (silver wax) or gold during die bonding.

It is to be noted that rust is often generated in the lead frame only of the palladium or palladium alloy layer. Therefore, a nickel layer is generally formed as an underlayer, FIG. 1 is a diagram showing a section of the lead frame (soldering lead) of the semiconductor component. For ease of seeing, a rather thick plated layer is shown.

That is, in a soldering lead 30, for example, the surface of a lead frame material such as an iron-nickel alloy 31 is once coated with the underlayer including a nickel layer 32, and further coated with an upper layer of a palladium layer 33 (or palladium alloy layer).

In order to mount electronic components such as the semiconductor component on the printed wiring board and actually solder the component by a flow soldering method, a method comprises: inserting the soldering lead terminal in the through hole of the printed wiring board; and bringing a soldering land formed around the through hole, and the soldering lead terminal into contact with a jet flow of a molten solder to solder the component. Under such a circumstance, a through hole is plated with copper to form the plated through hole in order to perform high-reliability soldering/mounting.

FIG. 2 is a longitudinal section view of the through hole, showing that the soldering lead terminal of the semiconductor component is inserted in the plated through hole of the printed wiring board.

Specifically, soldering lands 41 are disposed on the lower and upper surfaces of a printed wiring board 40, and these lands 41 are connected to each other via a plated through hole 42. A soldering lead terminal 43 of a semiconductor device is inserted in the through hole 42, and a portion to be soldered 44 is constituted between the lands 41 and plated through hole 42 and the soldering lead terminal 43.

In this condition, the jet flow of the molten solder is brought into contact with the lower surface of the printed wiring board 40 from below in FIG. 2, that is, the portion to be soldered 44 on the lower surface of the board to perform the flow soldering.

During the soldering/mounting, it is necessary to supply the solder having a sufficiently molten state to the portion to be soldered 44 so that satisfactory wettability is obtained. In other words, this is necessary for satisfying satisfactory electric connection and sufficient mechanical strength/connection of the portion to be soldered 44. Moreover, the printed wiring board 40 including the plated through hole 42 must be sufficiently filled with the solder in the through hole 42 and be wetted up.

In the related art, the electronic component is soldered onto the printed wiring board, liquid flux is generally applied in order to secure soldering property. This liquid flux is applied by methods such as immersing, brushing, spraying, and foaming. A post flux for use in an electronic industry is generally constituted of a main component obtained by blending and dissolving rosin as a base resin and hydrohalide of amine as an activator in a lower alcohol-based organic solvent such as isopropyl alcohol.

However, since the temperature of the lead frame rises in a die bonding or wire bonding step during the manufacturing of the semiconductor component, even palladium or palladium alloy superior in a bonding property has a problem of deterioration of solder wettability of the lead frame during the soldering/mounting onto the printed wiring board. That is, the solder wettability of the soldering lead terminal of the semiconductor component is deteriorated.

FIG. 3 is a longitudinal section view of the through hole, showing a soldering state of the soldering lead terminal whose wettability is deteriorated.

Specifically, the deterioration of the wettability of a soldering lead terminal 53 prevents the wetting-up of the solder into a plated through hole 52, and a soldering land 51 disposed on the upper surface of a printed wiring board 50 is not sufficiently wetted up. Such wetting-up defect of a solder 54 is similarly generated in the tin-lead solder heretofore used, or the potential candidates of the lead-free solder such as the tin-silver-copper based solder and tin-copper based solder.

On the other hand, as the technique for the lead-free solder, the tin-silver-copper based solder is the potential candidate. This solder is used to prepare the soldering lead terminal of the electronic component subjected to various types of plating, and the terminal is inserted in the through hole plated with the pre-flux as the potential candidate for a printed wiring board surface treatment, which does not contain lead. When the tin-silver-copper based solder is used to solder the component, a disadvantage referred to as lift-off (bonding defect) is known to be generated. That is, the solder floats from the copper land of the printed wiring board. FIGS. 4A, 4B are bird's-eye views of the lift-off generated in the lead-free solder.

As described above, the solder in the molten state is not sufficiently filled or wetted into the plated through hole, or the lift-off occurs. Then, when the printed wiring board is mounted on the electronic apparatus and used, because of applied stresses (e.g., temperature change, vibration, acceleration, deformation by deflection of the printed wiring board, and the like) or changes with time, the soldering lands, that is, printed wirings disposed on the lower and upper surfaces of the printed wiring board are disconnected each other. Alternatively, there is a problem that the solder bonding is detached and the disconnection easily occurs. In other words, reliability of the electronic apparatus on which the printed wiring board is mounted is remarkably degraded.

(Second Related Art)

FIG. 5 is an explanatory view of an example of a soldering procedure in which one surface of a printed wiring board 60 is reflow-soldered and the other surface is flow-soldered by a related-art method. It is to be noted here that this related-art example shows an example of the printed wiring board 60 including a plated through hole 61 and encircled numerals 1 to 9 denote step numbers.

Specifically, at first in step 1, an adhesive 63 for bonding an electronic component 12 (e.g., SMD such as a chip component) to be flow-soldered is applied, and subsequently in step 2 the corresponding electronic component 12 is mounted. Thereafter, in step 3 the adhesive 63 applied in the step 1 is hardened, and the electronic component 12 is fixed onto a land 64 (circuit pattern).

Next in step 4, the printed wiring board 60 is reversed, and solders 65 such as cream solders are supplied beforehand onto the lands 64 on which soldering terminals of electronic components 62, 66 to be reflow-soldered are laid, Subsequently, in step 5, the electronic components 62, 66 such as the chip component and QFP IC are mounted.

Thereafter, in step 6, the reflow soldering is performed by a reflow soldering apparatus. Specifically, the solder 65 supplied in the step 4 is heated and molten, and portions to be soldered of the electronic components 62, 66 such as the chip component and QFP IC between soldering terminals 67 and lands 64 are soldered.

After the reflow soldering is completed, in step 7, for example, lead terminals 69 of an insertion type electronic component 68 (hereinafter referred to as an insertion component) such as a connector is inserted in the through hole 61 on the side of the reflow soldered surface of the printed wiring board. In step 8 the flow soldering is carried out by a flow soldering apparatus.

Specifically, the portion to be soldered formed between the land 64 and the electronic component 62 fixed on the land 64 in the step 3, and the portion to be soldered formed between the land 64 including the plated through hole 61 and the lead terminals 69 of the insertion component 68 inserted in the through hole 61 in the step 7 are brought into contact with the jet flow of the solder in the molten state. The solder is supplied to these portions to be soldered, and the flow soldering is performed.

Herein, it is general to apply the liquid flux in order to secure the soldering property upon the flow soldering of the electronic component 12 or insertion component 68 onto the printed wiring board 60. Such liquid flux is applied by the methods such as immersing, brushing, spraying, and foaming. The post flux for use in the electronic industry is generally constituted of the main component obtained by blending and dissolving rosin as the base resin and hydrohalide of amine as the activator in the lower alcohol-based organic solvent such as isopropyl alcohol.

By the above-described procedure, the printed wiring board 60 is cooled as in step 9 of FIG. 5, the soldering of the portions to be soldered in the opposite surfaces of the board is completed, and fillets 600 of the solder are formed on the portions to be soldered of the SMD (electronic component 12) and insertion component 68.

In this event, in case where the land 64 disposed on one surface of the printed wiring board 60 is connected to the land 64 disposed on the other surface via the through hole 61, in the flow soldering step 8, the solder 65 needs to wet up the inside of the plated through hole 61 and wet-spread over the opposite lands 64. Moreover, in case where the lead terminals 69 of the insertion component 68 are inserted in the plated through holes 61, as shown in the step 9, the solder 65 needs to wet-spread over the opposite lands 64 to form the fillets 600.

This prevents the plated through hole 61 from being cracked and causing circuit disconnection by stresses such as heat stress, acceleration, and vibration upon the mounting of the printed wiring board 60 onto the electronic apparatus. Therefore, reliability of the electronic apparatus operating by the printed wiring board 60 is prevented from being damaged.

Moreover, it is most important to prevent the solder of the portion reflow-soldered in the step 6 from being molten again in the step 8 of the flow soldering. That is, the temperature of the reflow-soldered portion rises by heat conducted from the jet flow of the solder which has been brought into contact with the printed wiring board 60 upon the flow soldering.

When the solder of the reflow-soldered portion is molten again during the flow soldering, the position of the reflow-soldered electronic component 62 moves during the flow soldering and a soldering defect is generated. In the extreme, the electronic component 62 is detached and moved from the land 64 constituting the portion to be soldered, and a circuit function defect is caused Even when the re-melting simply occurs, solder wet defect occurs and soldering strength drops.

To solve the problem, various soldering methods have been proposed.

For example, one example is described in Japanese Patent Application Laid-Open No. 2001-358456 (hereinafter referred to also as Patent Document 1). That is, in this related-art example, a tin-silver-bismuth based lead-free solder and tin-zinc-bismuth based lead-free solder are used. In this technique, "a melting range of each solder is allowed to shift and thereby disengagement or connection strength drop of the component connected by a second-surface reflow or first-surface reflow upon the flow soldering are suppressed" (see paragraph [0009] of the related-art example of Patent Document 1).

In the technique disclosed in the: related-art example, bismuth is mainly used as a melting point adjustment agent, and a bismuth content in the solder is controlled to adjust the melting range of the solder. However, when the solder contains bismuth, the solder of the portion to be soldered is easily embrittled. There is a problem that soldering strength rapidly and easily drops with respect to a cycle stress given to the portion to be soldered. In other words, there is no tenacity.

Further, in the related-art example, "phenomenon in which the component peels off from an electrode on a substrate together with the solder depending on the type of the component" (see paragraph [0005] of the related-art example) is described. However, a mechanism by which the phenomenon occurs is not clarified. Therefore, the problem is not solved by a theoretically appropriate technique. That is, bismuth is included in the lead-free solder, the melting point is thereby forced to drop, and an influence of temperature rise during the flow soldering is minimized if possible in the technique.

The present inventors have noted that "the phenomenon in which the component peels from the electrode on the substrate together with the solder", that is, the fillet peel from the land occurs only with respect to the electronic component coated with the tin-lead solder or including, for example, the plated soldering terminal during the soldering using a tin-silver-x (another element) based lead-free solder, and have observed the peeled portion using an electronic microscope. As a result, segregation of lead has been recognized in the peeled portion. Specifically, it has been clarified that a micro ternary eutectic alloy composition of tin-silver-lead is formed in an interface of the land and fillet and the melting point is as low as 178° C. (see "Experimental Consideration concerning SMT Fillet Peel of Lead-Free Solder" Kazuhiko Tanabe, Yu Saito, Article Name: the 15th Electronics Mounting Academic Lecture General Assembly Collected Papers).

FIGS. 6A and 6B are diagrams showing an end surface of the portion to be soldered showing the fillet peel, FIG. 6A is an explanatory view of a normal soldered state, and FIG. 6B is an explanatory view of the state of the peeled fillets 600. In the drawing, a peeled portion 70 is shown in an exaggerated manner for ease of seeing. Thus, the fillet peel is generated in a peeled manner from the interface of the land 64 and solder.

It is to be noted that in the above-described related-art example "three-elements based solders such as Sn—Ag—Bi and Sn—Zn—Bi based solders are noted in a close-up manner as potential candidates of a Pb-free solder alloy replacing the Sn—Pb based solder". "Sn-9 weight % Zn (melting point 199° C.) has a substantially appropriate melting point, but the solder surface is remarkably oxidized in the soldering in the atmosphere, and the solder is not easily used" (see paragraph [0003] of a first related-art example). This is set aside in a boundary point of the scope of the present invention.

Particularly, at a filing time of this related-art example, the flow soldering technique of the printed wiring board using the tin-9 zinc solder (tin-9 wt % zinc solder, the numeral before the element similarly denotes weight % hereinafter) had not been established yet. The flow soldering technique of the printed wiring board using the tin-9 zinc solder was thereafter published by Japanese Patent Application Laid-Open No. 2001-293559 as Patent Document 2, and technical establishment is known.

(Third Related Art)

Diffusion of lead toxicity into natural environments and influence thereof onto human bodies have raised problems, and the soldering of the electronic apparatus and printed wiring board has been performed by the lead-free solder without using the lead. However, most of presently used lead-free solders are lead-free solders, whose melting point is high at about 220° C. An optimum soldering temperature is higher than the soldering temperature (about 240° C. to 250° C.) of the tin-lead solder which has heretofore been used by about 10° C. to 15° C. and is in a range of about 250° C. to 255° C.

To flow-solder the printed wiring board on which the electronic component is mounted, namely, a work to be soldered, a heat stress is imposed onto the printed wiring board and electronic component. Specifically, it is necessary to bring the portion to be soldered, that is, the surface to be soldered of the printed wiring board into contact with the solder having the molten state and to solder the portion, Moreover, the heat stress of the presently used lead-free solder having the high melting point becomes larger than before, and therefore a problem is that life of the electronic apparatus becomes shorter than before. As a countermeasure, development for enhancing heat resistance of the electronic component and development for realizing the flow soldering with a low-temperature solder have been performed.

The heat stress has a large influence on the life of the electronic component. Specifically, when the flow soldering is performed with the low-temperature solder, the electronic apparatus having a long life can be realized. Additionally, if the solder having an optimum soldering temperature lower than that of the tin-lead solder heretofore used is employed, the electronic apparatus having a longer life than before can be realized.

As described above, the temperature of the solder during the flow soldering appears as a difference of reliability which cannot apparently be judged from the electronic apparatus. Therefore, as an important index in supplying the high-reliability electronic component to a user, a flow soldering technique using the solder having a low optimum soldering temperature has been noted.

The melting point of the tin-zinc solder (e.g., the melting point of the tin-9 zinc solder) is about 199° C. and is low as compared with the melting point of another lead-free solder (e.g., about 220° C.). There is an advantage that the heat stress imposed onto the printed wiring board or the electronic component can be reduced during the flow soldering. However, it is regarded as impossible to flow-solder the printed wiring board using the tin-zinc solder, because soldering properties such as the wettability are not good.

Already in Japanese Patent Application No. 2002-4185, the present inventors have filed a patent application of a technique comprising: subjecting the land to be soldered or plated through hole of the printed wiring board to leveler treatments such as a hot air leveler (HAL) treatment by the tin-zinc solder to form a solder layer containing tin and zinc as main components on the surface of the board. Thereby, the electronic component in which the palladium or palladium alloy layer is formed on the surface of the soldering lead terminal of the electronic component can be soldered with superior wettability, and connection reliability of the portion to be soldered is also high.

Thereby, it has become possible to perform the flow soldering with the solder which has a temperature similar to or lower than the conventional temperature. The palladium or palladium alloy layer has been used for a lead-free member replacing the tin-zinc solder layer heretofore broadly used.

Herein, it is to be noted that the HAL treatment is a treatment comprising: immersing the printed wiring board into the solder or metal having the molten state; thereafter drawing the printed wiring board out of the solder in the molten state; and spraying air or inactive gas to the board to level the board.

For a printed wiring board on which a large number of various electronic components are mounted and which includes a large number of portions to be soldered, to collectively flow-solder the respective portions to be soldered, major factors for influencing the soldering properties such as the wettability and wet-up property of the solder are controlled. Thereby, the influence of other sub factors onto the soldering properties can be ignored. This enhances and uniforms soldering qualities of a large number of portions to be soldered. Additionally, this is necessary for enhancing and stabilizing the soldering qualities of the printed wiring boards produced in mass.

Therefore, in the flow soldering method using the tin-zinc solder, the present inventors have specified major factors in the printed wiring board, for enhancing the wettability and wet-up property of the tin-zinc solder in the land to be soldered and plated through hole in the printed wiring board. It has been regarded as a technical problem to clarify conditions for performing the flow soldering method using the tin-zinc solder with the stable soldering quality, and the flow soldering method has been developed.

SUMMARY OF THE INVENTION

It is therefore an object of the present invention to provide a soldering method in which soldering/mounting superior in solder wettability is possible, and a solder joint member superior in wettability in order to solve the problem of the second related art, Moreover, another object of the present invention is to realize a printed wiring board superior in overall reliability including a packaging technique of a semiconductor component and to thereby realize an electronic apparatus having a high reliability as the whole apparatus including the electronic components (first object).

Further, the present invention has been developed in consideration of the problem of the second related art, and an object thereof is to securely prevent land peel during use of a lead-free solder and make possible the soldering/packaging of a printed wiring board superior in soldering quality and reliability (second object).

Additionally, the present invention has been developed in consideration of the problem of the third related art, and an object thereof is to provide a flow soldering method using a tin-zinc solder, in which conditions of a printed wiring board superior in wettability of a solder in a portion to be soldered and wetting-up of the solder of a plated through hole are specified and thereby a low-temperature solder is used to make possible the soldering/packaging of the printed wiring board superior in the soldering quality and reliability (third object).

(First Aspect of the Invention)

To achieve the first object, according to the present invention, there is provided a soldering method for soldering an electronic component including a palladium or palladium alloy layer formed on the surface thereof and also including a soldering lead terminal to a printed wiring board including a soldering land and plated through hole, the method comprising the steps of: forming a solder layer containing tin and zinc as main components on the land and the surface of the through hole by a HAL treatment; inserting and mounting the lead terminal in the through hole; bringing the printed wiring board into contact with a jet flow of a solder containing tin and zinc as the main components; and thereby supplying the solder to the land and through hole.

Here, as described above, the HAL treatment is a treatment for spraying heated air to the substrate dipped in a bath of molten solder to level the substrate in a method of coating a substrate with the solder and soldering the electronic component on the coating in order to enhance a soldering property in the electronic circuit substrate.

Under this circumstance, when the printed wiring board is brought into contact with the jet flow of the solder, the solder wets the lead terminal and wets upwards to reach the upper surface of the land via the inside of the through hole.

Here, a flux for use in soldering the lead terminal with the solder preferably contains an acrylic acid adduct of rosin and an activator including a sarcosine framework.

Moreover, according to the-present invention, there is provided a soldering method for soldering an electronic component including a soldering lead terminal plated as desired to a printed wiring board including a plated through hole, comprising the steps of; forming a solder layer containing tin and zinc as main components on the surface of the through hole by a HAL treatment; inserting and mounting the lead terminal in the through hole; bringing the printed wiring board into contact with a jet flow of a solder containing tin and zinc as the main components; and thereby supplying the solder to the through hole so that lift-off is reduced or prevented.

Under this circumstance, when the printed wiring board is brought into contact with the jet flow of the solder, the solder wets the lead terminal and wets upwards via the inside of the through hole.

Here, the flux for use in soldering the lead terminal with the solder preferably contains the acrylic acid adduct of rosin and the activator including the sarcosine framework.

Moreover, according to the present invention, there is provided a solder joint member for soldering a semiconductor component to a printed wiring board. The semiconductor component includes a soldering lead terminal obtained by forming a palladium or palladium alloy layer on the surface of the terminal, the printed wiring board includes a soldering land or soldering through hole formed of copper, and the semiconductor component is joined to the land or through hole via a solder layer containing tin and zinc as main components.

Here, the semiconductor component includes, for example, a lead frame.

Further, the flux for use in soldering the lead terminal with the solder preferably contains the acrylic acid adduct of rosin and the activator including the sarcosine framework.

Additionally, according to the present invention, there is provided a solder joint member for soldering an electronic component to a printed wiring board. The electronic component includes a soldering lead terminal plated as desired, and the printed wiring board includes a soldering through hole including a first solder layer containing tin and zinc as main components formed on the surface of the hole by a HAL treatment. The lead terminal is inserted in the through hole and mounted, and includes a second solder layer which mainly contains tin and zinc as the main components and which is formed by bringing the printed wiring board into contact with a jet flow of a solder containing tin and zinc as the main components. The electronic component is joined to the through hole via the second solder layer.

Under this constitution, the joining by the second solder layer is performed so as to reduce or prevent the lift-off.

Moreover, the flux for use in soldering the lead terminal with the solder preferably contains the acrylic acid adduct of rosin and the activator including the sarcosine framework.

The soldering method and solder joint member according to the present invention is characterized in a constitution in which the solder superior in wettability with respect to palladium or palladium alloy can be used to form a superior soldering state between the soldering land and through hole formed of copper.

(1) That is, there is provided a soldering method comprising: inserting and mounting a soldering lead terminal of an electronic component including a palladium or palladium alloy layer formed on the surface thereof in a through hole of a printed wiring board which includes a soldering land and plated through hole and in which a solder layer containing tin and zinc as main components is formed on the soldering land and the surface of the plated through hole by a HAL treatment; bringing the printed wiring board into contact with a jet flow of a solder containing tin and zinc as the main components; and thereby supplying the solder to the soldering land and plated through hole to solder the electronic component.

Palladium and palladium alloy indicate a satisfactory wettability to the soldering which contains tin and zinc as the main components. Moreover, the layer of the tin-zinc solder which contains tin and zinc as the main components and which sufficiently wets is formed on the soldering land and the surface of the plated through hole formed of copper by the HAL treatment.

Therefore, the soldering land and plated through hole on which the solder layer containing tin and zinc as the main components is formed, the plated through hole, and the soldering lead terminal of the electronic component which is inserted in the through hole and which includes the palladium or palladium alloy layer formed on the surface of the terminal are brought into contact with the jet flow of the solder which contains tin and zinc as the main components. Then, the solder wets the soldering lead terminal and sets upwards the inside of the plated through hole, and the satisfactory soldered state superior in wettability can be obtained.

(2) Further, there is provided a solder joint member constituted to join a semiconductor component which includes a lead frame and in which a palladium or palladium alloy layer is formed on the surface of a soldering lead terminal of the semiconductor component to a soldering land or soldering through hole of a printed wiring board formed of copper via a solder containing tin and zinc as main components.

The solder containing tin and zinc as the main components has appropriate hardness and superior elongation characteristic. For example, a high-temperature elongation in 125° C. indicates 66% for a conventional solder containing tin and 37 weight % of lead, indicates an equal or more value 67% for a solder containing tin and 9 weight % of zinc, and only indicates 12% for a solder containing tin, 3 weight % of silver, and 0.5 weight % of copper. That is, with the joining by the solder containing tin and zinc as the main components, a tough solder joint member can be obtained.

Moreover, the solder containing tin and zinc as the main components has a superior wettability with respect to palladium or palladium alloy and also with respect to copper.

(3) Further, it has been found that the acrylic acid adduct of rosin and the activator including the sarcosine framework are used in a flux composition and thereby further satisfactory solder wettability is achieved. The present invention has been completed.

Therefore, according to the solder joint member of the present invention, the solder joint is tenacious in a high-reliability lead-free semiconductor component in which palladium is used in the plating of the lead frame, and in the soldering/mounting of the lead-free semiconductor component onto the printed wiring board. Not only mechanical connection but also electric connection are superior. From the solder joint member in the soldering/mounting of these electronic components onto the printed wiring board, an electronic apparatus remarkably superior in reliability can be realized.

(Second Aspect of the Invention)

To achieve the second object, according to the present invention, there is provided a soldering method for soldering with respect to a printed wiring board having portions to be soldered on opposite surfaces, comprising the steps of: reflow-soldering an electronic component to one surface of the printed wiring board by a lead-free solder containing at least tin, silver, and copper; subsequently controlling the soldering of the portion to be soldered formed on the other surface of the printed wiring board by a tin-9 zinc solder in a temperature range of 220° C. to 230° C.; and holding the temperature of the reflow-soldered portion to be soldered at 178° C. or less to perform flow soldering.

Here, the electronic component includes a soldering terminal coated with a tin-lead solder.

Further, a plated through hole is formed in the printed wiring board, and further the printed wiring board is subjected to HAL treatment by a tin-zinc solder. Here, the HAL treatment is a treatment for spraying heated gas (air) to the substrate dipped in a bath of molten solder to level the substrate in a method of coating a substrate with the solder and soldering the electronic component on the coating in order to enhance a soldering property in the electronic circuit substrate.

Moreover, the flux for use in the flow soldering preferably contains the acrylic acid adduct of rosin and the activator including the sarcosine framework.

In this case, the solder does not contain bismuth.

The soldering method of the present invention is characterized in that the flow soldering is performed so as to prevent the temperature of the portion to be soldered on a reflow-soldered surface from exceeding 178° C. as a melting point of a ternary eutectic alloy of tin-silver-lead.

(1) Specifically, there is provided a soldering method comprising: reflow-soldering an electronic component including a soldering terminal coated with a tin-lead solder to one surface of a printed wiring board by a lead-free solder containing at least tin, silver, and copper; subsequently controlling the solder of the portion to be soldered formed on the other surface of the printed wiring board by a tin-9 zinc solder in a temperature range of 220° C. to 230° C.; and holding the temperature of the reflow-soldered portion to be soldered at 178° C. or less to perform flow soldering.

When the temperature of the tin-9 zinc solder is controlled in a range of 220° C. to 230° C. to perform the flow soldering, the temperature of the reflow-soldered portion to be soldered is held at 178° C. or less as the melting point of the ternary eutectic alloy of tin-silver-lead.

Therefore, the ternary eutectic alloy of tin-silver-lead formed in the interface of the fillet and land in a micro size is not molten, and the fillet peel is solved Moreover, since the solder alloy does not contain bismuth, the solder of the portion to be soldered is not embrittled.

(2) Further, in the above soldering method (1), when the printed wiring board including the plated through hole is used, the printed wiring board subjected to the HAL treatment by the tin-zinc solder is used.

When the printed wiring board subjected to the HAL treatment by the tin-zinc solder is used, during the flow soldering by the tin-9 zinc solder, the tin-9 zinc solder can easily wet up in the plated through hole, and the tin-9 zinc solder wets/spreads not only over the land of the flow-soldered surface but also over the land of the reflow-soldered surface. Therefore, the soldering superior in the soldering quality can be performed.

(3) The flux for use in the flow soldering contains the acrylic acid adduct of rosin and the activator including the sarcosine framework. When the acrylic acid adduct of rosin and the activator including the sarcosine framework are used in the flux composition, the composition can easily wet up in the through hole during the flow soldering by the tin-9 zinc solder, and the soldering superior in the soldering quality can be performed.

Specifically, according to the present invention, the portions to be soldered exist in opposite surfaces of the printed wiring board, and the soldering is performed on one surface side by the reflow soldering method and on the other surface side by the flow soldering method. Even when the micro ternary eutectic alloy of the tin-silver-lead as a cause for the land peel is formed in the interface of the portion to be soldered by the reflow soldering, the lead-free solder not containing bismuth can be used to flow-solder the other surface side without exceeding the melting point of the ternary eutectic alloy of tin-silver-lead. Since this soldering method is established, the land peel with the use of the lead-free solder is surely prevented, and the soldering/mounting of the printed wiring board superior in soldering quality and reliability is possible.

(Third Aspect of Invention)

To achieve the third object, according to the present invention, there is provided a flow soldering method for bringing a printed wiring board on which an electronic component is mounted into contact with a jet flow of a solder containing tin and zinc as main components, that is, a tin-zinc solder to perform soldering, the method comprising the steps of: forming a layer of a solder rich in tin not containing bismuth and lead or a layer of tin on a land to be soldered and the surface of a plated through hole of the printed wiring board beforehand; thereafter mounting the electronic component; and subsequently bringing the printed wiring board into contact with the jet flow of the tin-zinc solder to solder the board.

Specifically, the layer of the tin-rich solder or tin is formed on the land to be soldered and the surface of the plated through hole of the printed wiring board, so that the wettability of the tin-zinc solder or wetting-up property in the plated through hole are enhanced, and satisfactory soldering quality is obtained.

It is to be noted that the tin-rich solder containing bismuth is not used. This is because the solder after the soldering is embrittled and superior tenacity of the solder containing tin and zinc as the main components is blocked. Of course, lead is not used for the lead-free solder.

The tin-rich solder not containing bismuth and lead for use in the above-described flow soldering method is any one of a solder containing tin, silver, and copper as the main components, that is, a tin-silver-copper based solder, a solder containing tin and silver as the main components, that is, a tin-silver based solder, and a solder containing tin and copper as the main components, that is, a tin-copper based solder. The solder has a content of tin of 90 weight % or more.

Specifically, when the tin-silver-copper based solder, tin-silver based solder, or tin-copper based solder is used, and the content of tin is 90 weight % or more, satisfactory wet-spread property of the tin-zinc solder in the land to be soldered is obtained. Moreover, the satisfactory wetting-up property of the tin-zinc solder in the plated through hole is obtained.

Further, since the tin-silver-copper based solder, tin-silver based solder, and tin-copper based solder are also broadly used as the lead-free solder, the existing leveler apparatus can be used to easily form the land on the land to be soldered and plated through hole of the printed wiring board.

In the flow soldering method, a palladium or palladium alloy layer is formed on the surface of a soldering terminal of the electronic component to be mounted on the printed wiring board.

In other words, the palladium or palladium alloy layer on the soldering terminal surface exhibits superior wettability to the tin-zinc solder. Moreover, the tin-rich solder layer or tin layer formed on the land to be soldered and plated through hole of the printed wiring board is also superior in the wet-spread or wet-up of the tin-zinc solder. Therefore, the printed wiring board having superior soldering quality is obtained.

In the flow soldering method, the electronic component to be mounted on the printed wiring board includes the lead terminal, the palladium or palladium alloy layer is formed on the lead terminal surface, and the lead terminal is inserted in the plated through hole and mounted.

In this flow soldering method, the tin-rich solder layer or tin layer is disposed on a plated through hole inner wall, and the palladium or palladium alloy layer is formed on the lead terminal surface of the electronic component inserted in the plated through hole. Therefore, the tin-zinc solder also indicates superior wettability with respect to the lead terminal of the electronic component and the plated through hole inner wall. At the contact time with the jet flow of the tin-zinc solder, the tin-zinc solder quickly wets up in the plated through hole, and satisfactory soldering can be performed.

In the flow soldering method, the temperature of the jet flow of the tin-zinc solder is in a range of 220° C. to 250° C.

It has been necessary to perform the flow soldering operation at a temperature higher than the melting point by 40° C. or more in order that another lead-free solder or related-art tin-lead solder obtains satisfactory wettability. However, the tin-zinc solder can obtain the satisfactory wettability and wet-up property at a temperature higher than the melting point by 20° C. or more. Therefore, even when the temperature of the jet flow of the solder is low at about 220° C., the satisfactory wettability can be obtained. Moreover, at 220° C. or more, there is hardly a difference of superiority of wettability by temperature.

Therefore, at a temperature in a range of 220° C. to 250° C. lower than that of the related-art solder, the satisfactory soldering operation can be obtained.

The flux for use in the flow soldering contains the acrylic acid adduct of rosin and the activator including the sarcosine framework.

Thereby, the heat resistance of the flux is enhanced, and accordingly persistent wettability can be enhanced. In the contact of the printed wiring board with the jet flow of the tin-zinc solder, the wet spread of the tin-zinc solder in the land to be soldered and the wet-up of the tin-zinc solder in the plated through hole are secured.

BRIEF DESCRIPTION OF THE DRAWINGS

FIG. 6A is an explanatory view of a normal soldering state, and FIG. 6B is an explanatory view of the state of peeled fillets 600 showing a peeled portion in an exaggerated manner for ease of seeing;

FIGS. 15A, 15B are tables showing a result of confirmation of occurrence conditions of fillet peel, FIG. 15A shows types of a solder, types of plating of an electronic component, and a result of analysis of a soldering procedure stage in which the peel occurs, FIG. 15B shows a result of measurement of temperature of a portion to be soldered completely soldered by reflow soldering during the flow soldering;

FIG. 15C is a diagram showing a heat insulation tape for inhibiting heat conduction being attached to a surface to be flow-soldered opposite to a surface reflow-soldered with QFP IC before the flow soldering;

FIGS. 16A and 16B show tables showing the result of check of presence/absence of fillet peel using the soldering method of the present invention, FIG. 16A is a table collectively showing the types of the solder for the reflow soldering, types of plating of the electronic component, and the temperature of the tin-9 zinc solder for use in the flow soldering as factors, and presence/absence of the fillet peel, and FIG. 16B is a table comparing the temperatures of portions during the flow soldering in the type of the solder and appropriate solder temperatures for use in the soldering;

DESCRIPTION OF THE PREFERRED EMBODIMENT (First Embodiment)

A soldering method and solder joint member according to a first embodiment of the present invention will be described hereinafter in detail with reference to the drawings.

Figure 7:
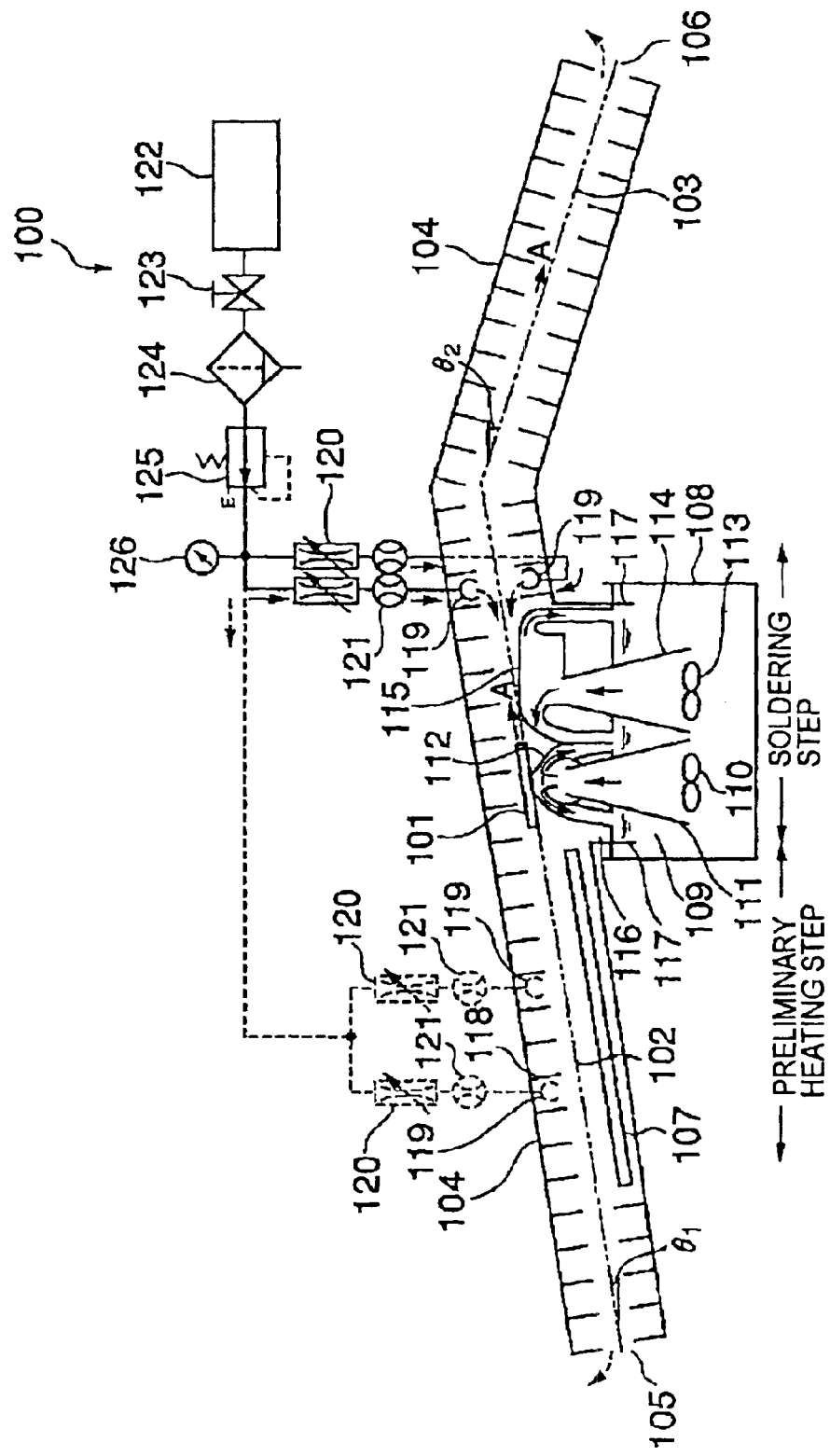
FIG. 7 is a longitudinal sectional view showing an example of a soldering apparatus which realizes a soldering method of the present invention.

First, a constitution of a soldering apparatus will be described with reference to FIG. 7. FIG. 7 is a longitudinal sectional view showing an example of the soldering apparatus which realizes the soldering method of the present invention. It is to be noted that a nitrogen gas supply system is shown by symbols.

Initially, lands and through holes of a printed wiring board are coated with a tin-zinc solder (tin-9 weight % zinc solder) by a HAL treatment. A method of performing the HAL treatment on the printed wiring board (by the tin-zinc solder) is known and therefore omitted from the drawing. For example, the method of performing the HAL treatment is described in Japanese Patent Application Laid-Open No. 2001-168513.

Here, as described above, the HAL treatment is, for example, a treatment for spraying heated air to the substrate dipped in a bath of molten solder to level the substrate in a method of coating a substrate with the solder and soldering an electronic component onto the coating in order to enhance a soldering property in the electronic circuit substrate.

Subsequently, the electronic component (e.g., semiconductor component having a lead terminal type soldering terminal) including a soldering lead terminal plated with palladium or palladium alloy is inserted in the through hole of the printed wiring board and mounted (see FIG. 2), and a work to be soldered is formed.

On the other hand, for the printed wiring board on which the electronic component including the work to be soldered, that is, the soldering lead terminal plated with palladium is mounted, after flux is applied to a surface to be soldered by a flux application apparatus (not shown) as usual, the soldering is performed by a soldering apparatus 100 shown in FIG. 7.

The soldering apparatus 100 shown in FIG. 7 is constituted to perform a soldering operation in atmosphere of an inactive gas, namely, nitrogen gas having low oxygen concentration.

Specifically, a conveyor for conveying the work to be soldered, that is, printed wiring board 101 is constituted of a first conveyor 102 for elevation-angle conveyance (elevation angle θ1) and second conveyor 103 for depression-angle conveyance (depression angle θ2). A tunnel-shaped chamber 104 is disposed to cover these conveyors.

As shown in FIG. 7, a longitudinal section of the tunnel-shaped chamber 104 has an inverted V shape, and a conveying-in port 105 and conveying-out port 106 are constituted to have the same height from a horizontal plane. Since the height of the conveying-in port 105 is constituted to be the same as that of the conveying-out port 106, it is easy to connect the soldering apparatus 100 to another apparatus and use the apparatus in line. Moreover, it is most important to easily retain atmosphere in the chamber at a temperature higher than that of the atmosphere outside the chamber 104, and the atmosphere in which components (e.g., oxygen concentration) are stable can be formed.

The first and second conveyors 102, 103 include holding claws for holding opposite side ends of the printed wiring board 101, and each conveyor includes two conveyor frames disposed on opposite side ends and in parallel with each other. Further, one conveyor frame is usually constituted to be movable/adjustable in a width direction of the printed wiring board 101, so that the printed wiring boards 101 having different widths can be held. A shown arrow A shows a conveyance direction of the printed wiring board 101.

Moreover, a preheater 107 for preliminarily heating the printed wiring board 101, and a solder tank 108 for performing a soldering step are disposed along the first conveyor 102 in the tunnel-shaped chamber 104.

The preheater 107 of the preliminary heating step preliminarily is disposed to heat the printed wiring board 101 to which flux has been applied beforehand and to reduce prepositive activation of the flux and heat shock given to the printed Wring board 101 and mounted electronic component.

Further, the solder tank 108 of the soldering step contains a tin-zinc solder 109 (tin-9 % zinc solder) which is heated by a heater (not shown) and which has a molten state. This molten solder 109 is sent to a first spray nozzle 111 by a first pump 110 to form a first jet flow 112. Moreover, a second pump 113 sends the solder to a second spray nozzle 114 to form a second jet flow 115.

Figure 1:
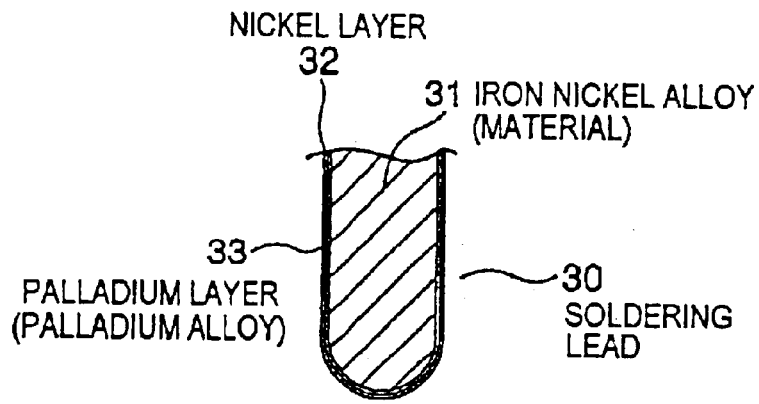
FIG. 1 is a sectional view of a lead frame of a semiconductor component.
Figure 2:
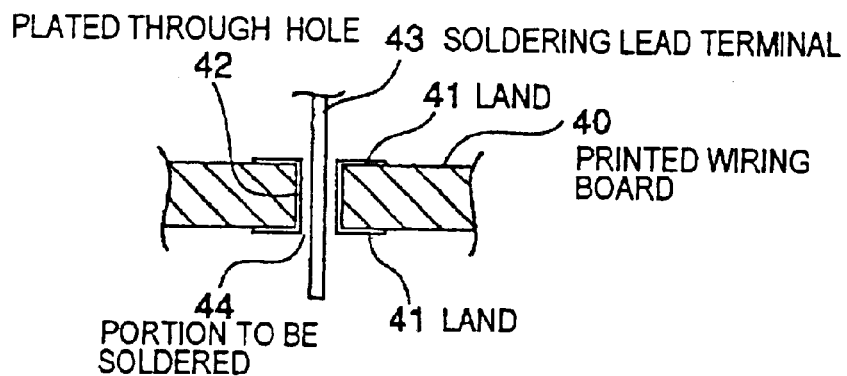
FIG. 2 is a sectional view showing that a lead terminal of a semiconductor component is inserted in a printed wiring board including a plated through hole.

Subsequently, these jet flows 112, 115 are brought into contact with the lower surface of the printed wiring board 101, that is, the surface to be soldered on which a portion to be soldered 44 including a land 41, through hole 42, and soldering lead terminal 43 of the electronic component exists as shown in FIG. 2. Thereby, the molten solder is supplied to the portion to be soldered 44 to solder the portion.

The preheater 107 is disposed in the tunnel-shaped chamber 104. However, the solder tank 108 is constituted such that an opening 116 is disposed in the tunnel-shaped chamber 104 and the first and second jet flows 112 and 115 are positioned in the tunnel-shaped chamber 104 through the opening 116. With such a structure, a skirt 117 is disposed in the opening 116 formed in the tunnel-shaped chamber 104 to maintain the sealing of the tunnel-shaped chamber 104. The skirt 117 is immersed in the molten solder in the solder tank 108 to realize complete sealing.

Further, a large number of plate members, namely, inhibit plates 118 are disposed along the longitudinal direction of the tunnel, that is, the conveyance direction of the conveyor in the tunnel-shaped chamber 104. Additionally, the inhibit plates 118 are disposed so that plate surfaces cross at right angles to the conveyance direction of the conveyor.

Specifically, the inhibit plates 118 form a labyrinth seal in the tunnel-shaped chamber 104, and are constituted to prevent an unnecessary atmospheric flow from being generated in the tunnel-shaped chamber 104.

In this event, the inhibit plates 118 are disposed down to the conveyor from an upper wall of the tunnel-shaped chamber 104 and disposed up to the conveyor from a lower wall of the tunnel-shaped chamber 104.

Discharge ports 119 for supplying nitrogen gas as inactive gas into the tunnel-shaped chamber 104 are disposed among the inhibit plates 118 disposed after the solder tank 108 as viewed from the conveyance direction, and a target nitrogen gas supply flow rate can be adjusted by flow rate adjustment valves 120 and flow rate meters 121. The nitrogen gas is supplied from a nitrogen gas supply apparatus 122 of a bomb or PSA type, and supplied to the flow rate adjustment valves 120 via an open/close valve 123, filter 124 for removing impurities, and pressure control valve 125 for adjusting a supply pressure to a target. A pressure meter 126 is disposed to monitor the pressure.

For the nitrogen gas supply flow rate, oxygen concentration in the tunnel-shaped chamber 104 is measured by an oxygen concentration meter (not shown), for example, an atmosphere of the soldering step as a contact region of the printed wiring board 101 with the jet flow of the molten solder 109 is sampled, and the rate of the sampled region is measured. The flow rate adjustment valves 120 are adjusted so as to obtain the target oxygen concentration, and the flow rate is set.

Moreover, if necessary, for a constitution as shown by a broken line, the discharge port 119 for nitrogen gas supply is similarly disposed in the vicinity of the preheater 107 of the preliminary heating step, and the oxygen concentration of the atmosphere in the vicinity of the preheater 107 may also be measured by the oxygen concentration meter.

Next, an operation of the soldering apparatus 100 shown in FIG. 7 will be described below.

The printed wiring board 101 in which the flux has been applied beforehand to the lower surface of the printed wiring board 101 including the portion to be soldered, that is, the surface to be soldered is conveyed through the conveying-in port 105 of the soldering apparatus 100 shown in FIG. 7. Then, the opposite side ends of the board are held by the holding claws of the first conveyor 102, and conveyed in the arrow A direction at the conveyance elevation angle θ1.

Subsequently, for example, the portion to be soldered is preliminarily heated at about 100° C. by the preheater 107. Successively, the lower surface of the printed wiring board 101, namely, the surface to be soldered is brought in contact with the first and second jet flows 112 and 115, for example, at a temperature of about 250° C., and the molten solder 109 is supplied to the portion to be soldered to solder the portion.

Thereafter, the printed wiring board 101 is transferred to the second conveyor 103 at the vertex of the tunnel-shaped chamber 104, conveyed at the conveyance depression angle θ2, and conveyed out of the conveying-out port 106 to complete the soldering.

This series of soldering operation is performed in the nitrogen gas atmosphere having low oxygen concentration. Specifically, the inside of the tunnel-shaped chamber 104 turns to the nitrogen gas atmosphere having the low oxygen concentration by the nitrogen gas supplied from the discharge port 119 for the nitrogen gas supply.

Figure 3:
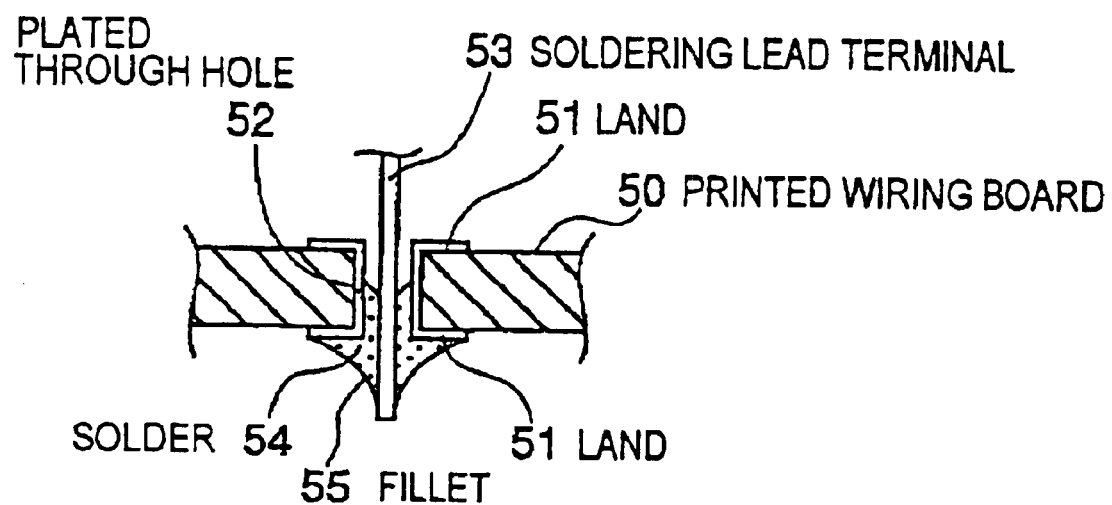
FIG. 3 is a sectional view showing a soldering state of a soldering lead terminal whose semiconductor drops.
Figure 4A:
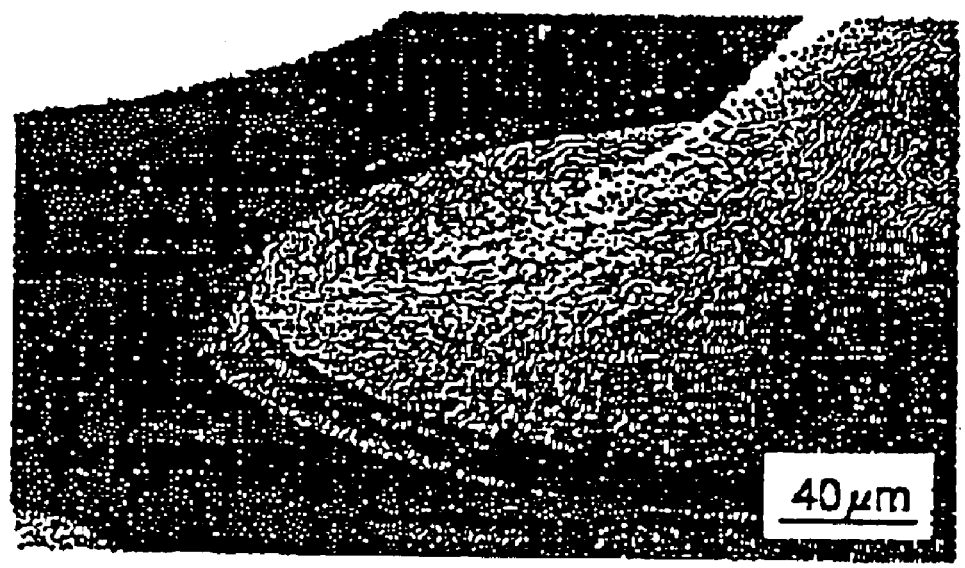
FIGS. 4A and 4B are bird's-eye views of lift-off generated in a lead-free solder.
Figure 4B:

By the series of soldering operation constituted as described above, the molten solder from the jet flow of the solder containing tin and zinc as the main components is supplied to the soldering land and plated through hole on which the solder layer containing tin and zinc as main components is formed. The solder is similarly supplied to the soldering lead terminal of the electronic component which is inserted in the through hole and which includes a palladium or palladium alloy layer on the surface of the terminal. Thereby, the tin-zinc solder wets the soldering lead terminal and wets up in the plated through hole, and the soldering also wet-spreads over the land disposed on a component insertion surface (the upper surface of the printed wiring board shown in FIGS. 2 and 3) to form a fillet (see 55 of FIG. 3). A satisfactory solder joint member superior in wettability can be obtained.

In other words, palladium and palladium alloy exhibit satisfactory wettability with respect to the solder containing tin and zinc as the main components. On the soldering land formed of copper and the surface of the plated through hole, the tin-zinc solder layer in which the solder containing tin and zinc as the main components is sufficiently wet is formed by the HAL treatment.

[First Embodiment]

Figures 8A, 8B:
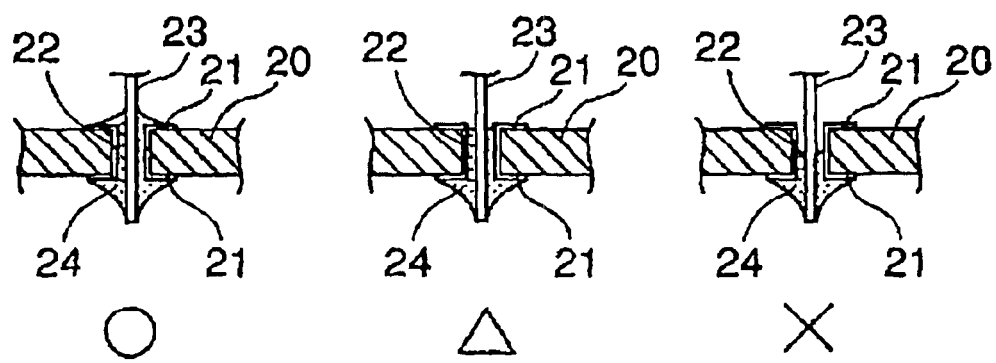
FIGS. 8A and 8B are diagrams showing a result of comparison of a soldering property in various solders and plating.

FIGS. 8A and 8B show a table and a diagram, respectively, showing a result of comparison of a soldering property, and FIG. 8A is a table collectively showing comparison results. FIG. 8B is a longitudinal sectional view of the portion to be soldered showing an evaluation standard (level) indicating a degree at which the molten solder wets up and is filled in the through hole of the portion to be soldered.

First, to evaluate the soldering property, the evaluation standard was determined. Specifically, as shown in FIG. 8B, "○" indicates a satisfactory soldered state in which the solder wets up in a through hole 22 and solder fillets are formed over lands 21 on lower and upper surfaces of a printed wiring board 20. A solder fillet 24 is formed on the land 21 of the lower surface of the printed wiring board 20 and the solder wets up in the through hole 22, However, the solder cannot wet-spread over the upper land 21 of the printed wiring board 20 and the fillet 24 is not formed This state is indicated as a slightly insufficient soldered state by "Δ". The solder fillet 24 is formed on the land 21 of the lower surface of the printed wiring board 20, but the solder does not sufficiently wet up in the through hole 22. Therefore, the solder cannot wet-spread over the upper land 21 of the printed wiring board 20 and the fillet 24 is not formed. This state is shown as an insufficient soldered state by "X".

On the other hand, to compare the soldering property, as the constitution of the portion to be soldered, three types having surface treated states of the soldering lead terminal were prepared. Specifically, the soldering lead terminal plated with a tin-10 weight % lead solder containing conventional lead, soldering lead terminal plated with gold, and soldering lead terminal including a nickel layer as an underlayer and a palladium or palladium alloy layer formed on the nickel layer were prepared.

In the meantime, as surface treated states of the land and through hole of the printed wiring board as another constituting element of the portion to be soldered, four types were prepared. Specifically, the followings were prepared: a. printed wiring board on which copper used as a wiring pattern or land is exposed; b. printed wiring board including the copper land and through hole subjected to the HAL treatment with a tin-37 weight % lead solder; c. printed wiring board including the copper land and through hole HAL-treated with a tin-9 weight % zinc solder; and d. printed wiring board obtained by HAL-treating the surface of the printed wiring board with the tin-9 weight % zinc solder and further applying antirust agent to the surface.

Moreover, as the types of the solder to be supplied to the portion to be soldered from the jet flow in the soldering step, the followings were prepared; a. a tin-37 weight % lead solder heretofore used; b. a tin-3 weight % silver-0.5 weight % copper solder as a potential candidate of a lead-free solder; c. tin-0.7 weight % copper solder; and d. tin-9 weight % zinc solder. It is to be noted that the temperature of the solder was set to a usually used solder temperature of 250° C.

Further, a relation of soldering property among these soldering lead terminals, printed wiring boards a to d, and solders a to d is collectively shown in a table of FIG. 8A.

Specifically, for the soldering lead terminals plated with the tin-37% zinc solder and gold, satisfactory soldering properties were obtained regardless of the types of the surface treatment of the land and through hole and the solder. However, from a demand for a lead-free constitution originated in an environmental problem, the plating treatment of the tin-10 weight % lead solder cannot be continued as the surface treatment of the soldering lead terminal of the electronic component in the future. Moreover, gold is extremely expensive, is therefore used only for a special purpose in which cost does not raise a problem, and is not used in mostly used general-purpose electronic component.

On the other hand, with the soldering lead terminal plated with palladium, the printed wiring board whose land and through hole are HAL-treated by the tin-9 weight % zinc solder is used, and the solder is supplied from the jet flow of the tin-9 weight % zinc solder. It is seen that the satisfactory soldering property is obtained only in this case.

That is, considering from mounting reliability of the electronic component manufactured by these all mounting operations from a viewpoint of a series of all mounting steps of manufacturing the semiconductor component and soldering/mounting the component onto the printed wiring board, for a palladium-plated lead frame, die bonding property by silver wax and wire bonding property by a gold wire are superior. During the soldering/mounting, the component is mounted on the printed wiring board HAL-treated by the tin-zinc solder, and the molten solder is supplied from the jet flow of the tin-zinc solder to solder the component. It is found out that most superior mounted member can be formed in this case.

Subsequently, to compare lift-off occurrence rates, three types were prepared as the plating treatment of an electronic component soldering lead terminal portion Specifically, the followings were prepared: (1) a soldering lead terminal plated with the tin-10 weight % lead solder containing conventional lead; (2) a soldering lead terminal including the nickel layer as the underlayer and gold plating on the upper layer of the nickel layer; and (3) a soldering lead terminal including the nickel layer as the foundation and the palladium or palladium alloy layer formed on the nickel layer. On the other hand, as the surface treated state of the through hole of the printed wiring board as the other constituting element of the portion to be soldered, two types were prepared.

Specifically, the followings were prepared: a) a printed wiring board in which pre-flux is applied as an antioxidant on copper used as the wiring pattern; and b) a printed wiring board whose through hole is HAL-treated with the tin-9 weight % zinc solder and which is 1.6 mm thick. Further, for through hole and land designs of the printed wiring board, nine types were prepared.

That is, the followings were prepared: 1) a through hole diameter of 0.8 mm, land diameter of 1.1 mm; 2) through hole diameter of 0.8 mm, land diameter of 1.4 mm; 3) through hole diameter of 0.8 mm, land diameter of 1.7 mm; 4) through hole diameter of 1.0 mm, land diameter of 1.3 mm; 5) through hole diameter of 1.0 mm, land diameter of 1.6 mm; 6) through hole diameter of 1.0 mm, land diameter of 1.9 mm; 7) through hole diameter of 1.2 mm, land diameter of 1.5 mm; 8) through hole diameter of 1.2 mm, land diameter of 1.8 mm; and 9) through hole diameter of 1.2 mm, land diameter of 2.1 mm.

Moreover, as the types of the solder to be supplied to the portion to be soldered from the jet flow in the soldering step, the followings were prepared, a) a tin-3 weight % silver-0.5 weight % copper solder as the potential candidate of the lead-free solder; and b) tin-9 weight % zinc solder. It is to be noted that the temperature of the solder was set to the usually used solder temperature of 250° C.

Figure 9:
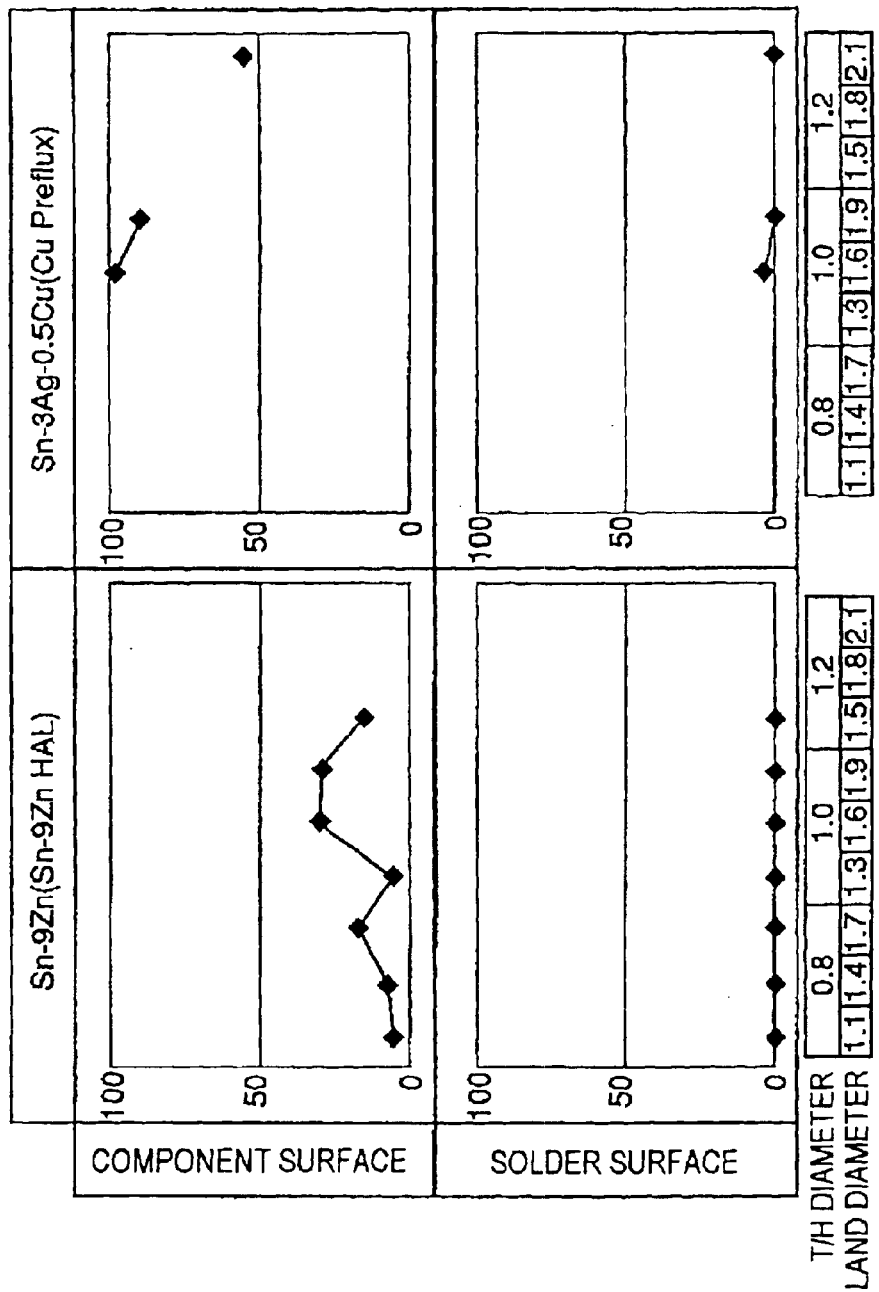
FIG. 9 is a diagram showing a relation between the lift-off in Sn—Pb plating and occurrence rate of land peel.
Figure 10:
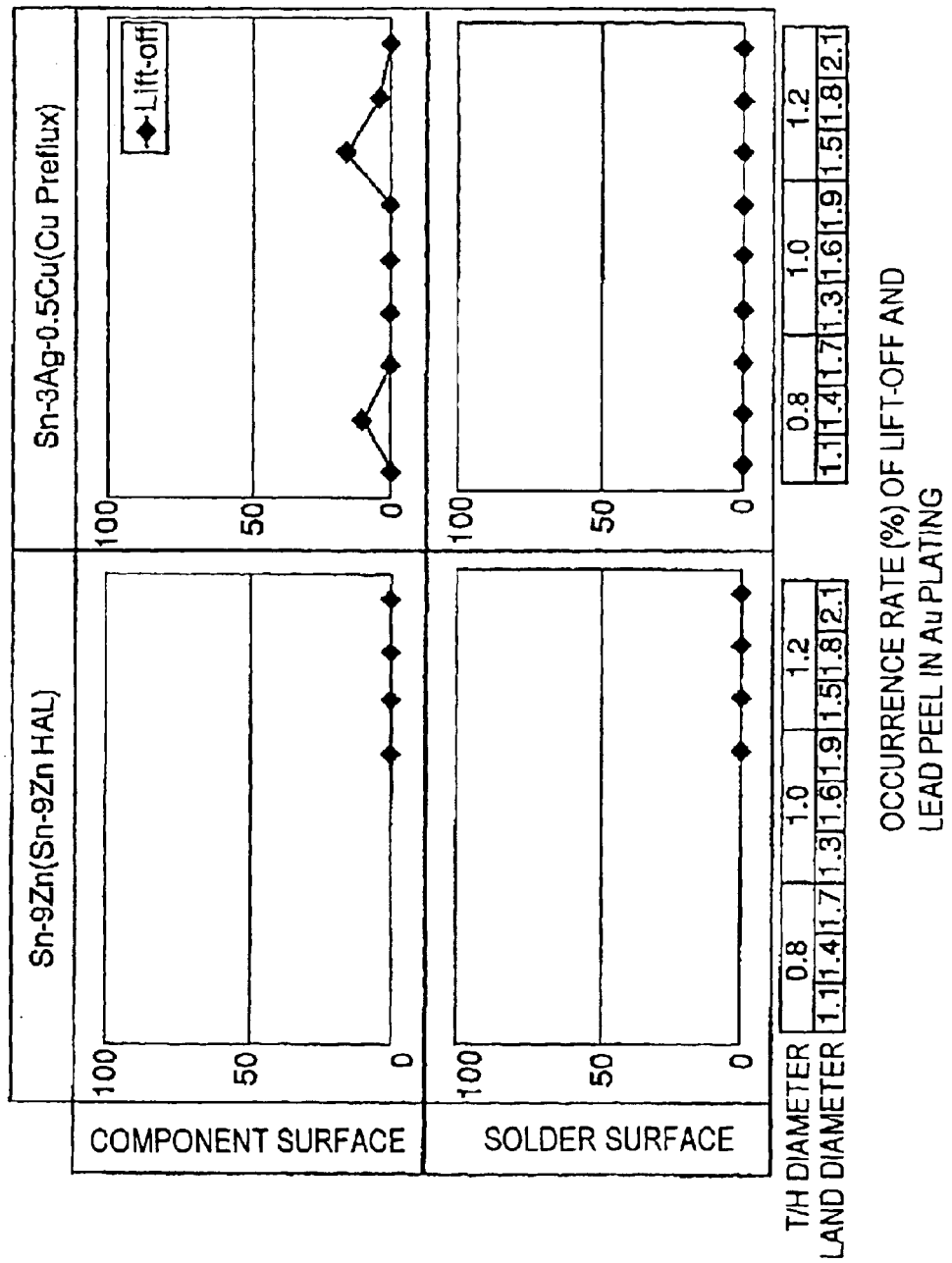
FIG. 10 is a diagram showing a relation between the lift-off in Au plating and occurrence rate of land peel.
Figure 11:
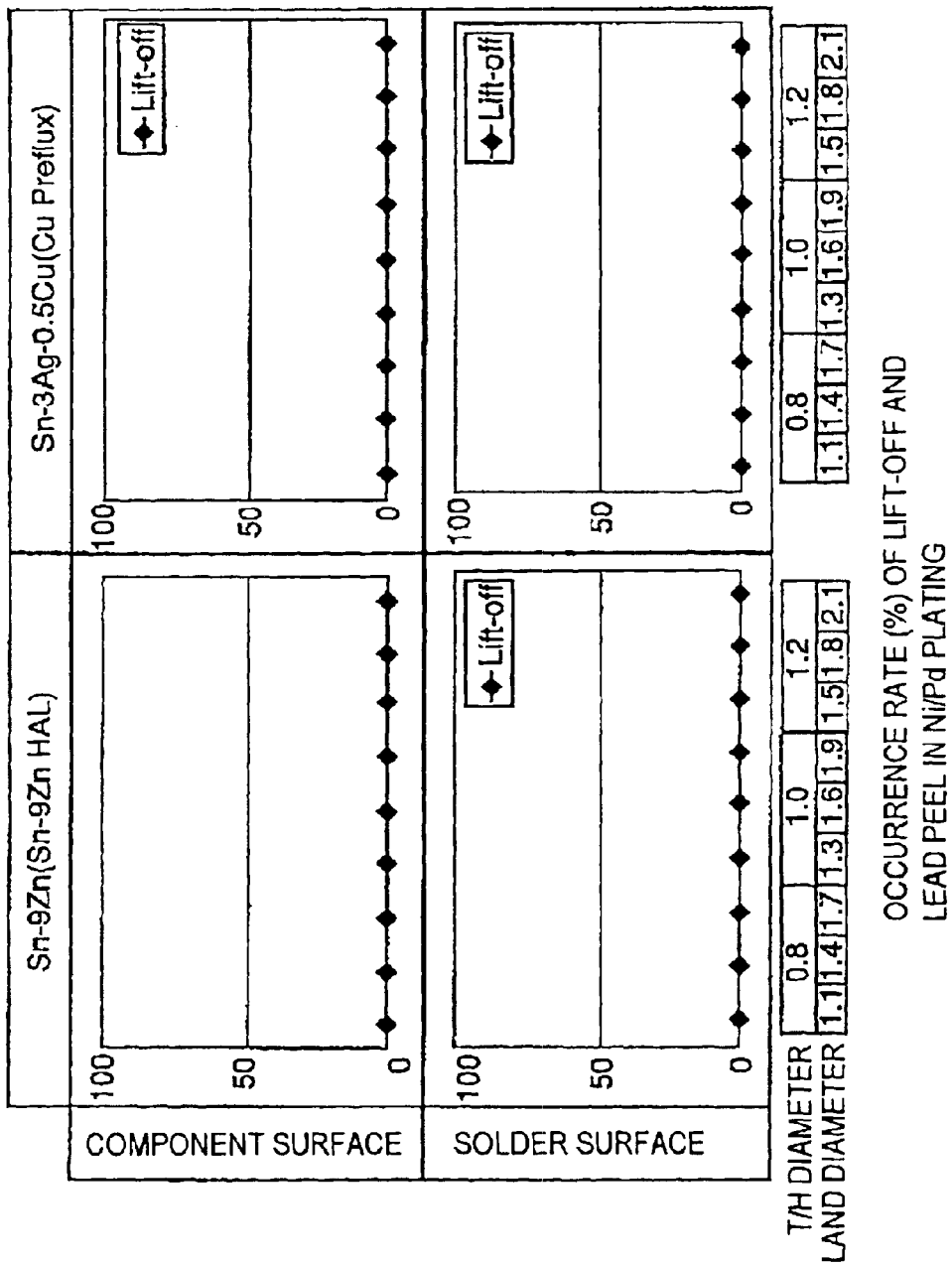
FIG. 11 is a diagram showing a relation between the lift-off in Ni/Pd plating and occurrence rate of land peel.

A relation of the lift-off occurrence rates among these soldering lead terminals 1 to 3, printed wiring boards a, b and solders a, b is collectively shown in tables of FIGS. 9 to 11. It is to be noted that in these diagrams T/H diameter denotes the through hole diameter and Land diameter denotes the land diameter.

Specifically, as shown in FIG. 9, in (1) the soldering lead terminal plated with the tin-10 weight % lead solder including conventional lead, for the printed wiring board to which pre-flux was applied and the tin-3 weight % silver-0.5 weight % copper solder as the potential candidate of the lead-free solder, the lift-off occurrence rate was 50%. The printed wiring board whose through hole was HAL-treated with the tin-9 weight % zinc solder had a lift-off occurrence rate of 50% or less. Reduction effect was recognized.

In the meantime, as shown in FIG. 11, in the soldering lead terminal including the nickel layer as the underlayer and the palladium or palladium alloy layer formed in the upper layer of the nickel layer, the tin-3 weight % silver-0.5 weight % copper solder as the potential candidate of the lead-free solder and the tin-9 weight % zinc solder had an equal lift-off occurrence rate of 0. Moreover, as shown in FIG. 10, for the soldering lead terminal including the nickel layer as the foundation and the gold-plated upper surface of the nickel layer, in some combination of the through hole and land diameters, the occurrence of lift-off was recognized in the tin-3 weight % silver-0.5 weight % copper solder. However, the lift-off occurrence rate was zero with the tin-9 weight % zinc solder. It has been seen that the occurrence is completely prevented.

Meanwhile, as compared with the conventional tin-lead solder, the tin-zinc based solder as the lead-free solder has a high melting point and bad wettability, because tin and zinc are the main components. Therefore, when the conventional post flux is used, sufficient wettability and joint reliability cannot easily be secured.

Therefore, in the present invention, from a viewpoint of enhancement of heat resistance of post flux and enhancement of solder wettability, instead of gum rosin as a resin component of the conventional post flux, the acrylic acid adduct of rosin having higher heat resistance was selectively used.

According to the present invention, from a viewpoint that persistent wettability as required capability of the post flux for use in the tin-zinc based solder should be secured, the activator to be blended was noted, and thereby the activator including the sarcosine framework was selectively used so that the persistent wettability was possible. The acrylic acid adduct of rosin for use in the present invention includes an addition reactant of acrylic acid and rosin or a rosin derivative further subjected to hydrogenation reaction. Examples of rosin include gum rosin, wood rosin, and tall oil rosin containing resin acids such as abietic acid, palustric acid, neoabietic acid, pimaric acid, isopimaric acid, and dehydroabietic acid as main components.

Examples of the activator including the sarcosine framework for use in the present invention include oleyl sarcosine, lauroyl sarcosine, and palm oil fatty acid sarcosine. Furthermore, in addition to the above-described specific constituting components, with the flux of the present invention, various components for use in a conventional flux can also be used such as resin, activator, solvent, antioxidant, delusterant, and other additives. Examples of the resin component for use in the conventional flux include various rosin derivatives such as gum rosin, polymerized rosin, deproportionated rosin, and hydrogenated rosin, and synthetic resins such as a polyamide resin and terpene resin.

Examples of the activator for use in the conventional flux include hydrohalide of amine, organic acids, organic amine, and organic halide. Concrete examples of hydrohalide of amine include diethylamine hydrochloride, and cyclohexylamine hydrobromide. Concrete examples of organic acids include adipic acid, stearic acid, and benzoic acid. Concrete examples of organic amines include hexylamine, dibutylamine, and triethylamine. Concrete examples of organic halides include 2,3-dibromo-1-propanol, and 2,3-dibromo-2-butene-1,4-diol. Examples of the solvent include isopropyl alcohol, acetic ether, and toluene. Furthermore, antioxidant, delusterant, and other additives are not especially limited, and various known agents may appropriately be selected and used.

The present invention will be described hereinafter in detail in terms of examples. A liquid flux composition including Examples 1 to 4 and Comparative Examples 1 to 3 was prepared, and spray-applied to the printed wiring board on which the electronic component was mounted, and the component was soldered by an automatic soldering apparatus. A soldered state was observed, and the soldering property was evaluated with "○", "Δ", and "X". The evaluation result is shown in Table 1 below.

(Example 1)

| | |
|---|---|
| Adipic acid | 1.0 wt % |
| Dibutyl amine | 1.0 wt % |
| Cyclohexylamine hydrobromide | 0.2 wt % |
| Oleyl sarcosine | 1.0 wt % |
| Acrylic acid adduct of rosin | 7.0 wt % |
| Hydrogenerated rosin | 7.0 wt % |
| Isopropyl alcohol | 82.8 wt % |

(Example 2)

| | |
|---|---|
| Sebacic acid | 1.0 wt % |
| 2,3-dibromo-1-propanol | 0.5 wt % |
| Diethylamine hydrochloride | 0.2 wt % |
| Lauroyl sarcosine | 1.0 wt % |
| Acrylic acid adduct of rosin | 10.0 wt % |
| Gum rosin | 5.0 wt % |
| Isopropyl alcohol | 82.3 wt % |

(Example 3)

| | |
|---|---|
| Octyl acid | 1.0 wt % |
| Benzoic acid | 1.0 wt % |
| Diphenylguanidine hydrobromide | 0.2 wt % |
| Palm oil fatty acid sarcosine | 1.0 wt % |
| Acrylic acid adduct of rosin | 20.0 wt % |
| Isopropyl alcohol | 77.8 wt % |

(Example 4)

| | |
|---|---|
| Glutaric acid | 1.0 wt % |
| 2,3-dibromo-1-propanol | 0.5 wt % |
| Cyclohexylamine hydrobromide | 0.2 wt % |
| Oleyl sarcosine | 1.0 wt % |
| Acrylic acid adduct of rosin | 7.0 wt % |
| Deproportionated rosin | 7.0 wt % |
| Isopropyl alcohol | 83.3 wt % |

(Comparative Example 1)

| | |
|---|---|
| Adipic acid | 1.0 wt % |
| Dibutyl amine | 1.0 wt % |
| Cyclohexylamine hydrobromide | 0.2 wt % |
| Gum rosin | 15.0 wt % |
| Isopropyl alcohol | 82.8 wt % |

(Comparative Example 2)

| | |
|---|---|
| Sebacic acid | 1.0 wt % |
| 2,3-dibromo-1-propanol | 0.5 wt % |
| Diethylamine hydrochloride | 0.2 wt % |
| Lauroyl sarcosine | 1.0 wt % |
| Gum rosin | 15.0 wt % |
| Isopropyl alcohol | 82.3 wt % |

(Comparative Example 3)

| | |
|---|---|
| Octyl acid | 1.0 wt % |
| Benzoic acid | 1.0 wt % |
| Diphenylguanidine hydrobromide | 0.2 wt % |
| Acrylic acid adduct of rosin | 10.0 wt % |
| Hydrogenerated rosin | 10.0 wt % |
| Isopropyl alcohol | 77.8 wt % |

TABLE 1

| | Ex. 1 | Ex. 2 | Ex. 3 | Ex. 4 | Compar. Ex. 1 | Compar. Ex. 2 | Compar. Ex. 3 |
|---|---|---|---|---|---|---|---|
| Evaluation Result | ○ | ○ | ○ | ○ | X | Δ | Δ |

In other words, as shown in Table 1, satisfactory soldering properties are obtained in Examples 1, 2, 3. As described above, it is seen that satisfactory electric connection and mechanical connection having sufficient strength as basic soldering joint conditions are obtained in the soldering method and solder joint member of the present invention. Additionally, the tin-zinc solder has appropriate hardness and superior elongation characteristic. For example, the related-art tin-37 weight % lead solder has a high-temperature elongation of 66% at 125° C., and the tin-9 weight % zinc solder has an elongation of 67% which is an equal or more value. On the other hand, the tin-3 weight % silver-0.5 weight % copper solder has an elongation of only 12%.

Therefore, to solder/mount the semiconductor component including the lead frame with the palladium or palladium alloy layer formed on the surface of the frame onto the printed wiring board, it is possible to obtain the satisfactory soldering property by the soldering method of the present invention. It is found out that it is possible to obtain the solder joint member which is tough and is superior in mechanical and electric connections and long-term reliability.

(Second Embodiment)

A second embodiment of the present invention will be described hereinafter in detail with reference to the drawings.

(1) Soldering Procedure

Figure 5:
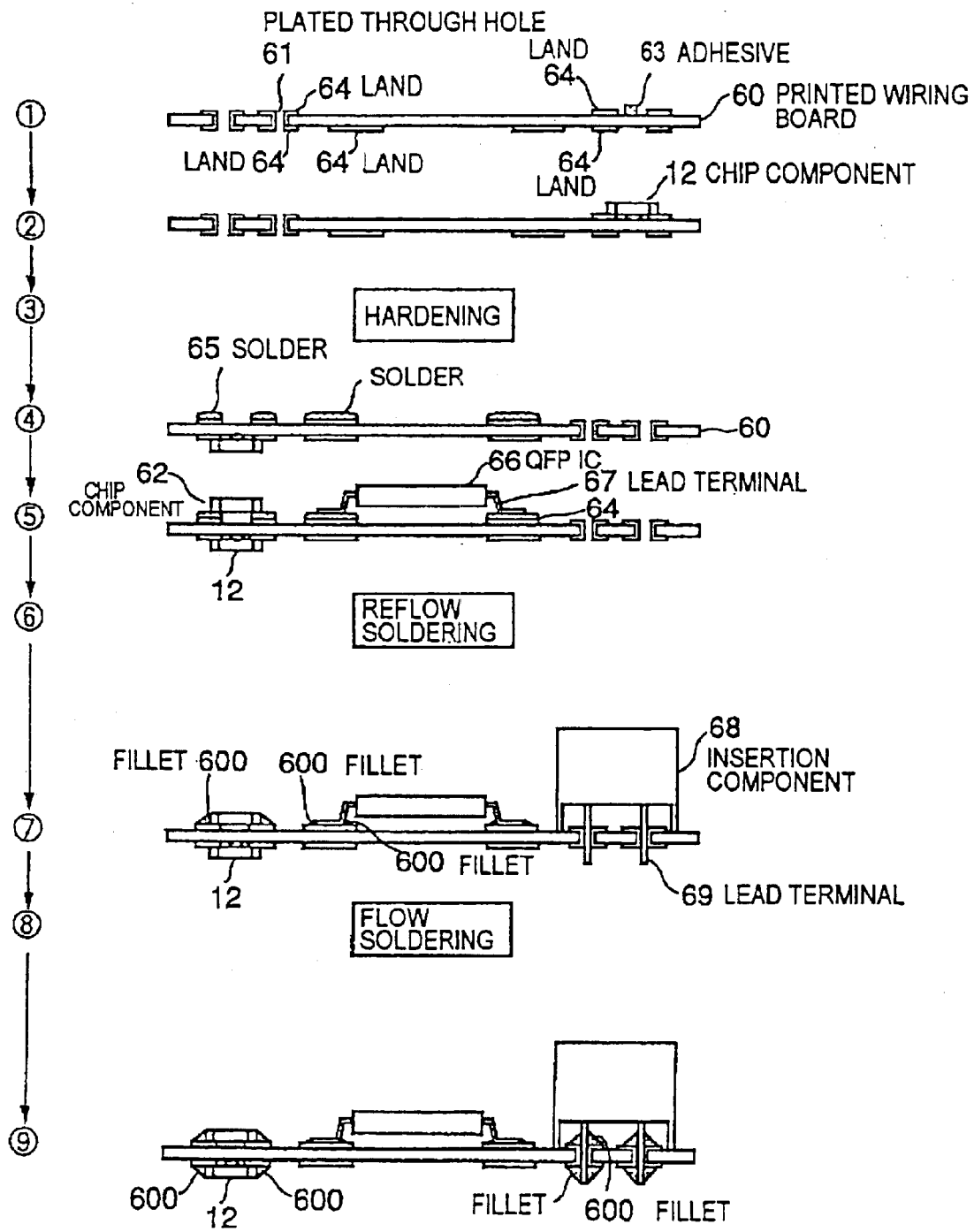
FIG. 5 is a diagram of a soldering procedure showing the conventional soldering method of the present invention.
Figure 6A:
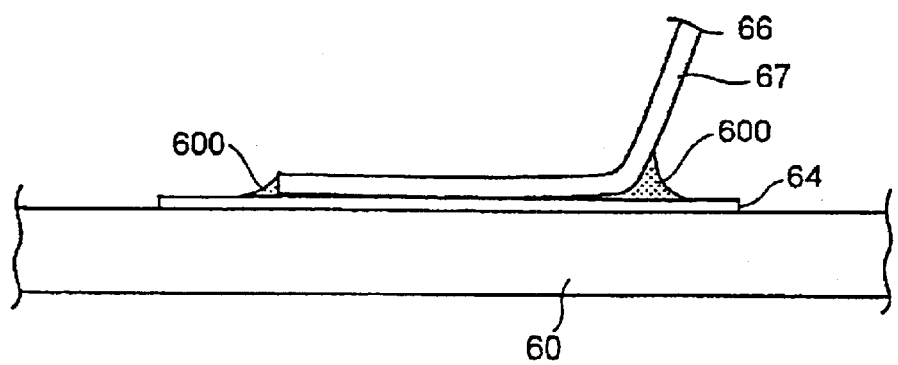
FIGS. 6A and 6B show an end surface of the portion to be soldered showing the fillet peel.
Figure 6B:
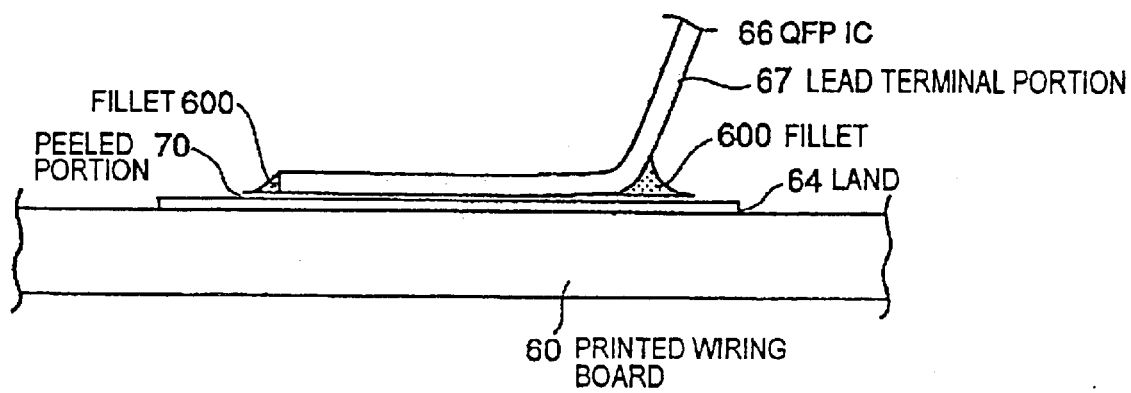

A soldering procedure for realizing the soldering method of the present invention will be described with reference to FIG. 12. The order of steps (1) to (9) is substantially the same as that of FIG. 5, but treatment content in each step is different from that of FIG. 5.

First in step (1), a printed wiring board 10 HAL-treated by the tin-zinc solder is prepared, and an adhesive 13 for bonding an electronic component (SMD) 12 to be flow-soldered is applied. Subsequently in step (2), the corresponding electronic component 12 is mounted. Thereafter in step (3), the adhesive 13 applied in the step (1) is cured, and the electronic component 12 is fixed onto lands 14.

Here, as described above, the HAL treatment is, for example, a treatment for spraying the heated gas (air) to the substrate dipped in the bath of molten solder to level the substrate in the method of coating the substrate with the solder and soldering the electronic component onto the coating in order to enhance the soldering property in the electronic circuit substrate.

Next in step (4) the printed wiring board 10 is reversed, and the cream solder 15 of tin-3 silver-0.5 copper (solid phase line temperature of 217° C., liquid phase line temperature of 220° C.) or cream solder 15 of tin-3.5 silver-0.75 copper (solid phase line temperature of 217° C., liquid phase line temperature of 219° C.) are supplied beforehand onto the lands 14 on which the soldering terminals of the electronic component 12 to be reflow-soldered are laid. Successively, in step (5), the chip component 62 whose soldering terminal is coated, for example, plated with the tin-zinc solder and electronic components 16 such as QFP IC are mounted on the lands 14. Naturally, the electronic component including another type of plating may also be included.

Thereafter, in step (6), the reflow soldering is performed by the reflow soldering apparatus. Specifically, the solder supplied in the above-described step is heated and molten, and the portions to be soldered of the chip component 62 and electronic components 16 such as the QFP IC formed between soldering terminals 17 (lead terminal portions) and lands 14 are soldered.

After the reflow soldering is completed, in step (7), for example, lead terminals 19 of an insertion component 18 such as the connector is inserted in a through hole 11 on the side of the reflow soldered surface of the printed wiring board 10. Moreover, in step (8) the jet flow of the molten tin-9 zinc solder whose temperature is controlled in a range of 220° C. to 230° C. by a temperature control apparatus in step (8) is brought into contact with the surface to be flow-soldered of the printed wiring board 10 to flow-solder the surface.

In other words, the portion to be soldered formed between the land 14 and the electronic component 12 fixed on the land 14 in the step (3), and the portion to be soldered formed between the land 14 including the plated through hole 11 and the lead terminals 19 of the insertion component 18 inserted in the through hole 11 in the step (7) are brought into contact with the jet flow of the molten tin-9 zinc solder. The tin-9 zinc solder is supplied to these portions to be soldered to flow-solder the portions.

Since the portions are flow-soldered by tin-9 zinc in this flow soldering step (8), the temperature is low at 220° C. to 230° C. Specifically, the portions can be flow-soldered at a very low temperature as compared with temperature of 245° C. to 250° C. regarded as appropriate in the related-art tin-37 zinc solder, or temperature of 250° C. to 255° C. regarded as appropriate in the lead-free solder 15 of tin-3 silver-0.5 copper or tin-3.5 silver-0.75 copper. Moreover, since the printed wiring board 10 is HAL-treated by the tin-zinc solder, the wetting-up of the tin-9 zinc solder in the plated through hole 11 is also extremely satisfactory.

In the flow soldering step (8), the solder of the reflow-soldered portion to be soldered, for details, the micro ternary eutectic alloy of tin-silver-lead formed between the lands 14 on which the components 16, 62 are mounted and fillets 150 is not heated at temperature exceeding a melting point of 178° C., and fillet peel does not occur.

As a result, as shown in step (9), the portions to be soldered existing on the opposite surfaces of the printed wiring board 10 are cooled and completely soldered. The fillets 150 of the solder including no fillet peel and having a satisfactory joined state are formed on the portions to be soldered of the SMD and insertion component 18, and the printed wiring board 10 superior in soldering quality is completed.

Moreover, since the flow soldering is performed by the tin-9 zinc solder, the lift-off phenomenon generated during the flow soldering can be prevented or reduced more than another lead-free solder. Further, since the lead-free solder not containing bismuth is used, the solder of the portion to be soldered is not embrittled. It is possible to perform the soldering/mounting which is tough against heat cycle stress, stress by repeatedly applied acceleration, and stress of vibration.

Since the acrylic acid adduct of rosin and the activator including the sarcosine framework is used in the flux composition to be applied during the flow soldering, the wetting-up of the tin-9 zinc solder in the through hole 11 can further be improved.

In the present invention, from a viewpoint of enhancement of heat resistance of the post flux, instead of gum rosin as the resin component of the related-art post flux, the acrylic acid adduct of rosin having higher heat resistance is selectively used.

Further, according to the present invention, from a viewpoint that the persistent wettability as the required capability of the post flux for use in the tin-zinc solder should be secured, the activator to be blended is also noted. The activator using the sarcosine framework is selectively used, so that the persistent wettability is possible.

The acrylic acid adduct of rosin for use in the present invention includes the addition reactant of acrylic acid and rosin or the rosin derivative further subjected to hydrogenation reaction. Examples of rosin include gum rosin, wood rosin, and tall oil rosin containing resin acids as main components such as abietic acid, palustric acid, neoabietic acid, pimaric acid, isopimaric acid, and dehydroabietic acid. Moreover, examples of the activator including the sarcosine framework for use in the present invention include oleyl sarcosine, lauroyl sarcosine, and palm oil fatty acid sarcosine.

In addition to the above-described specific constituting components, with the flux of the present invention, various components for use in the conventional flux can also be used such as resin, activator, solvent, antioxidant, delusterant, and other additives.

Examples of the resin component for use in the conventional flux include various rosin derivatives such as gum rosin, polymerized rosin, deproportionated rosin, and hydrogenated rosin, and synthetic resins such as a polyamide resin and terpene resin. Examples of the activator for use in the conventional flux include hydrohalide of amine, organic acids, organic amine, and organic halide. Concrete examples of hydrohalide of amine include diethylamine hydrochloride, and cyclohexylamine hydrobromide. Concrete examples of organic acids include adipic acid, stearic acid, and benzoic acid. Concrete examples of organic amines include hexylamine, dibutylamine, and triethylamine. Concrete examples of organic halides include 2,3-dibromo-1-propanol, and 2,3-dibromo-2-butene-1,4-diol. Examples of the solvent include isopropyl alcohol, acetic ether, and toluene.

Further, antioxidant, delusterant, and other additives are not especially limited, and various known agents may appropriately be selected and used.

(2) Constitution of Soldering Apparatus

Next, a constitution example and operation of a reflow soldering apparatus will be described with reference to FIG. 13.

The reflow soldering apparatus heats the portion to be soldered to which the solder is supplied beforehand to melt the solder, and solders the land and circuit pattern formed on the printed wiring board to the electronic component.

Examples of a heating method of the reflow soldering apparatus include hot wire heating by infrared rays, hot air heating, steam heating, heat transfer heating, and combined heating. In any method, the printed wiring board is heated and reflow-soldered in a chamber type heating furnace in order to maintain high-temperature atmosphere. Moreover, the board is often heated in atmosphere having low oxygen concentration in which inactive gases such as nitrogen gas are supplied.

Figure 13:
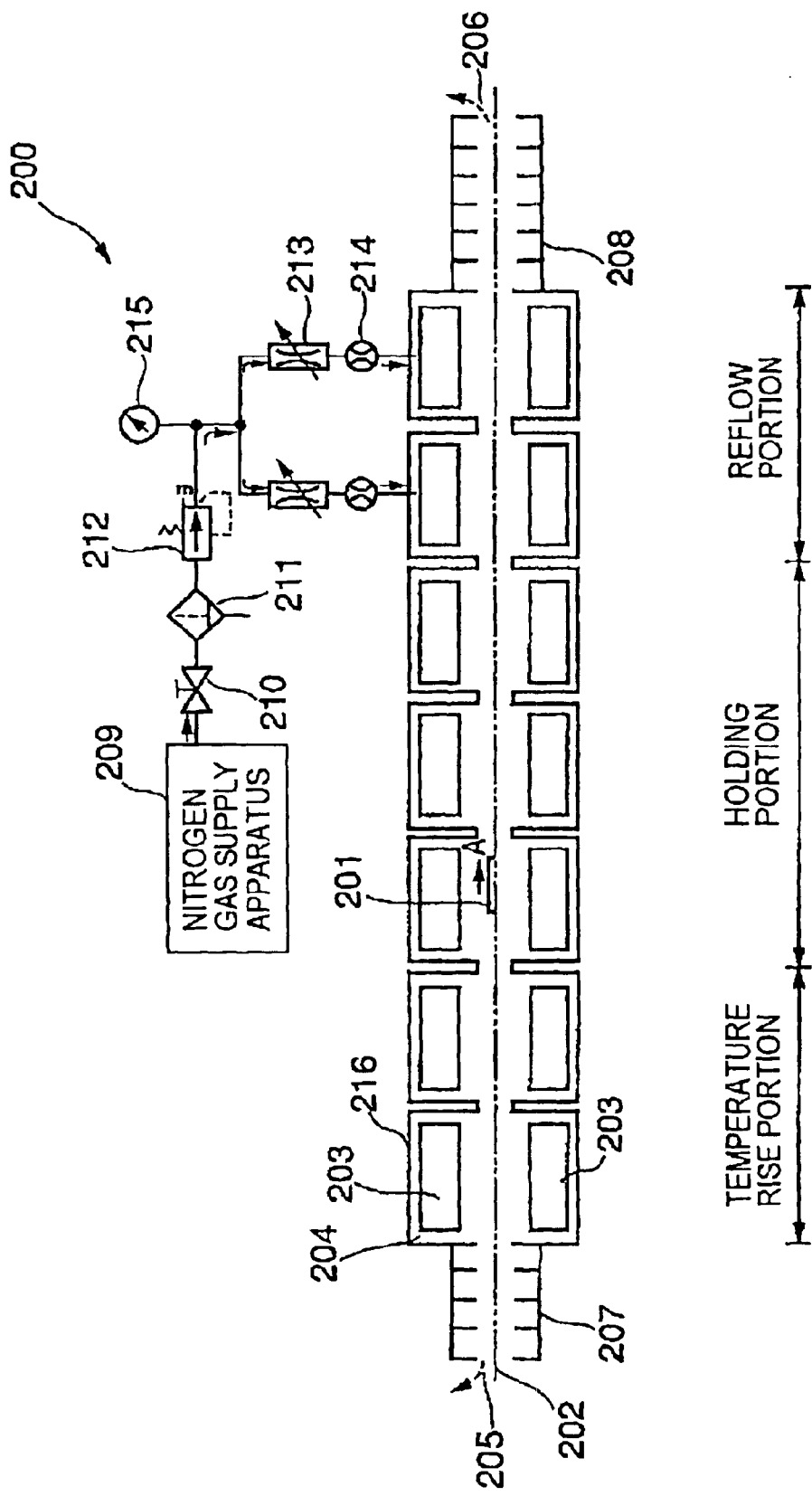
FIG. 13 is a side sectional view, that is, longitudinal sectional view showing one example of a reflow soldering apparatus.

FIG. 13 is a side sectional view, that is, longitudinal sectional view showing one example of a reflow soldering apparatus 200. It is to be noted that the nitrogen gas supply system is shown in a symbol diagram.

In this example, the reflow soldering apparatus has a so-called seven-zone constitution in which a heating furnace, that is, furnace member 216 is divided in seven regions. A heating chamber 204 including heating means 203 is vertically symmetrically disposed in which heating means 203 are disposed via a conveyor 202 for conveying a printed wiring board 201, which is a boundary, and 14 heating chambers 204 are disposed. Moreover, first and second zones correspond to a temperature rise portion heating chamber along a conveyance direction A of the printed wiring board 201, third to fifth zones correspond to a holding heating chamber, and sixth and seventh zones correspond to a reflow portion heating chamber.

Known hot air heating means and infrared heating means which are heating means 203 are used. Moreover, these heating means 203 are combined and used. For a supply heat amount to the printed wiring board 201, in the hot air heating means a final supply heat amount is determined by a hot air temperature, and a supply heat amount per unit time is determined by a hot air velocity.

Further, in the infrared heating means, the supply heat amount can be increased in proportion to substantially the fourth power of the surface temperature of an infrared heater. Additionally, the hot air temperature, hot air velocity, and surface temperature of the infrared heater are adjusted to thereby adjust the heating temperature of the printed wiring board 201, so that a targeted heating temperature profile is obtained.

Details of the conveyor 202 are not shown, and the conveyor is usually used to hold and convey the printed wiring board 201 by opposite side ends by two parallel conveyance chains. Herein, labyrinth portions, namely inlet labyrinth portion 207 and outlet labyrinth portion 208 are constituted by inhibit plates disposed in parallel in a conveying-in port 205 and conveying-out port 206. Sealing properties inside and outside the heating chamber 204 and outside the furnace member 216 are secured.

In the meantime, nitrogen gas is supplied to a reflow portion heating chamber in which the solder is molten, and nitrogen gas atmosphere having lowest oxygen concentration is formed in a reflow portion heating chamber. Specifically, after unnecessary materials are removed by a filter 211 through an open/close valve 210 from a nitrogen gas supply apparatus 209 of bomb or PSA type, a target pressure is maintained by a pressure control valve 212. A target flow rate is adjusted by a flow rate control valve 213 and flow rate meter 214, and the gas is supplied. A pressure meter 215 is for the pressure monitor.

The soldering operation is performed while the printed wiring board 201 is conveyed by the conveyor 202. Specifically, the printed wiring board 201 supplied through the conveying-in port 205 is conveyed in the arrow A direction. The board is passed and heated through the respective heating chambers 204 in order of the temperature rise portion →holding portion→reflow portion. The completely soldered printed wiring board 201 is conveyed out via the conveying-out port 206.

A heating reach temperature of the printed wiring board 201 in each heating chamber 204 is adjusted by the heat amount supplied to the printed wiring board 201 from the heating means 203 of each heating chamber 204, and is further adjusted by the hot air temperature, hot air velocity, and surface temperature of the infrared heater. Thereby, the printed wiring board 201 is heated and reflow-soldered with the targeted predetermined heating temperature profile.

For example, with the tin-silver-copper based lead-free solder for use in the present embodiment, that is, the cream solder of tin-3 silver-0.5 copper or tin-3.5 silver-0.75 copper, it is usual to control the temperature of the portion to be soldered in the reflow portion in a temperature range of about 230° C. to 240° C. and perform the soldering.

It is to be noted that the reflow soldering can also be performed in the atmospheric air without supplying nitrogen gas into the heating chamber 204 during the reflow soldering operation of the tin-silver-copper based lead-free solder. Additionally, when the reflow soldering is performed in the nitrogen gas atmosphere having low oxygen concentration, the portion to be soldered or solder of the printed wiring board 201 is prevented from being oxidized. The soldering can be performed with more satisfactory wettability than in the atmospheric air.

Next, the constitution example and operation of the flow soldering apparatus will be described with reference to FIG. 14. Here, FIG. 14 is a longitudinal sectional view showing one example of the flow soldering apparatus, and the nitrogen gas supply apparatus is shown in the symbol diagram.

A flow soldering apparatus 300 is constituted to perform the soldering operation in the atmosphere of the inactive gas, that is, nitrogen gas having the low oxygen concentration. It is to be noted that the flow soldering apparatus of FIG. 14 has a constitution similar to that of the flow soldering apparatus of FIG. 7.

Specifically, the conveyor for conveying the work to be soldered, that is, printed wiring board 301 is constituted of a first conveyor 302 for elevation-angle conveyance (elevation angle θ1) and second conveyor 303 for depression-angle conveyance (depression angle θ2). A tunnel-shaped chamber 304 is disposed to cover these conveyors.

Figure 14:
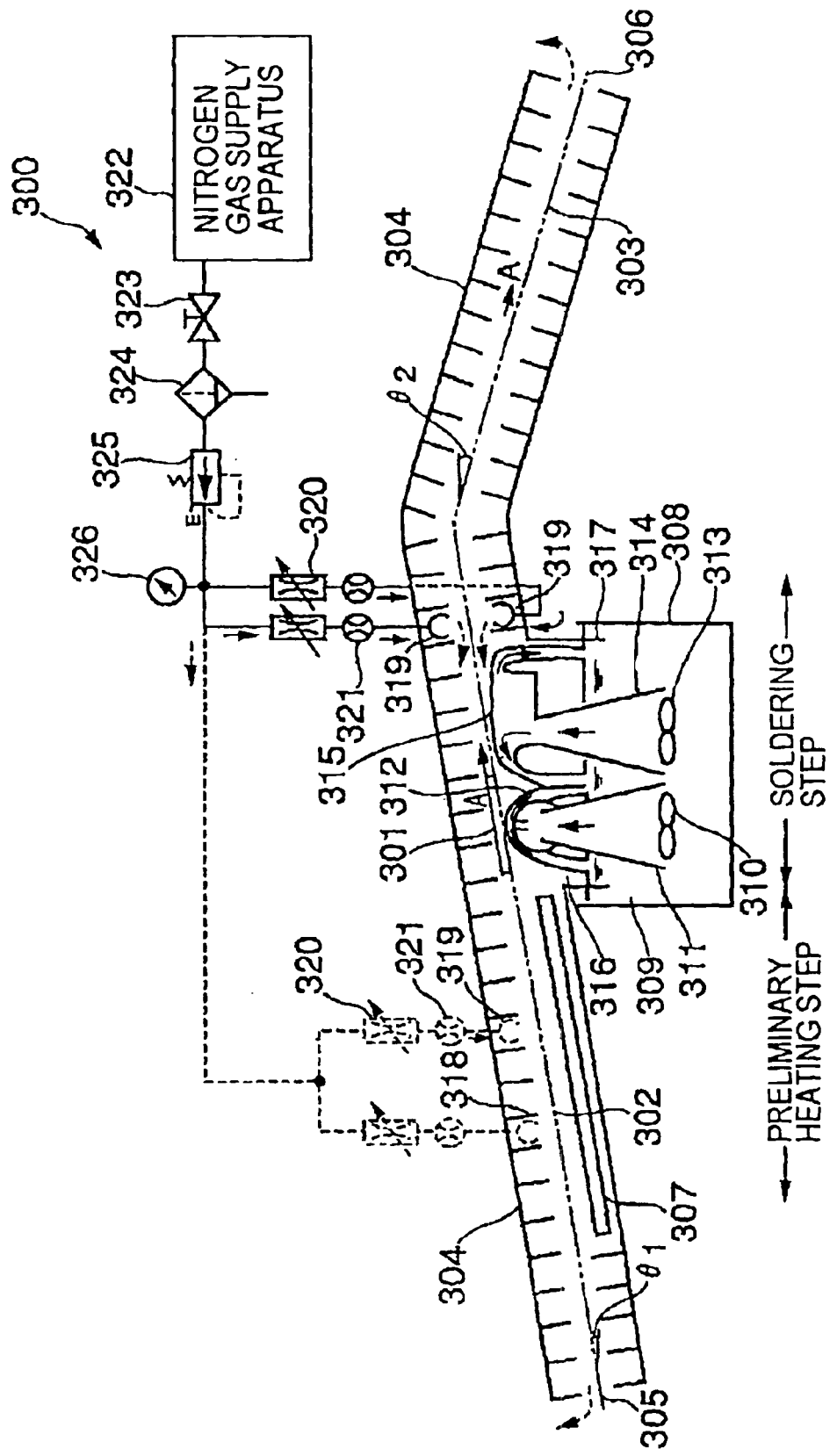
FIG. 14 is a diagram showing a constitution example of a flow soldering apparatus.

As shown in FIG. 14, a longitudinal section of the tunnel-shaped chamber 304 has an inverted V shape, and a conveying-in port 305 and conveying-out port 306 are constituted to have the same height from the horizontal plane. Thereby, it is easy to retain the atmosphere in the chamber 304 at the temperature higher than that of the atmosphere outside the chamber 304, and the atmosphere in which the components (e.g., oxygen concentration) are stable can be formed.

The first and second conveyors 302, 303 include holding claws for holding the opposite side ends of the printed wiring board 301, and each conveyor includes two conveyor frames disposed on opposite side ends and in parallel with each other. Moreover, a preheater 307 constituting the preliminary heating step of the printed wiring board 301, and a solder tank 308 constituting the soldering step are disposed along the first conveyor 302 in the tunnel-shaped chamber 304. It is to be noted that the shown arrow A indicates the conveyance direction of the printed wiring board 301.

The solder tank 308 of the soldering step contains a tin-9 zinc solder 309, and the solder 309 is heated by the heater, temperature sensor, and temperature control apparatus (not shown) and which has a molten state. The temperature is controlled to a temperature indicated beforehand. Moreover, this molten solder 309 is sent to a first spray nozzle 311 by a first pump 310 to form a first jet flow 312. Furthermore, a second pump 313 sends the solder to a second spray nozzle 314 to form a second jet flow 315.

Subsequently, these jet flows 312, 315 are brought into contact with the lower surface of the printed wiring board 301, namely, the surface to be flow-soldered of the lower surface of the printed wiring board 10 on which the portion to be soldered exists including the land 14 and through hole 11, and the soldering and lead terminals of the electronic component 12 as shown in the step (7) of FIG. 12. Thereby, the molten solder 309 is supplied to the portion to be soldered to solder the portion.

Moreover, the preheater 307 is disposed in the tunnel-shaped chamber 304. However, the solder tank 308 is constituted such that an opening 316 is disposed in the tunnel-shaped chamber 304 and the first and second jet flows 312 and 315 are positioned in the tunnel-shaped chamber 304 through the opening 316. It is to be noted that a skirt 317 is disposed in the opening 316. The skirt 317 is immersed in the molten solder 309 in the solder tank 308 to realize the complete sealing.

Furthermore, a large number of plate members, that is, inhibit plates 318 are disposed along the longitudinal direction of the tunnel, that is, the conveyance direction of the conveyors 302, 303 in the tunnel-shaped chamber 304. The plates form the labyrinth seal, and are constituted to prevent an unnecessary atmospheric flow from being generated in the tunnel-shaped chamber 304.

Discharge ports 319 for supplying nitrogen gas which is the inactive gas into the tunnel-shaped chamber 304 are disposed among the inhibit plates 318 disposed after the solder tank 308 as viewed from the conveyance direction, and the targeted nitrogen gas supply flow rate can be adjusted by flow rate adjustment valves 320 and flow rate meters 321. The nitrogen gas is supplied from a nitrogen gas supply apparatus 322 of a bomb or PSA type, and supplied to the flow rate adjustment valves 320 via an open/close valve 323, filter 324 for removing impurities, and pressure control valve 325 for adjusting a supply pressure to the target. A pressure meter 326 is disposed to monitor the pressure.

For the nitrogen gas supply flow rate, the oxygen concentration in the tunnel-shaped chamber 304 is measured by the oxygen concentration meter (not shown), for example, the atmosphere of the soldering step as the contact region of the printed wiring board 301 with the jet flows 312, 315 of the molten solder 309 is sampled, and the rate is measured. The flow rate adjustment valves 320 are adjusted so as to obtain the target oxygen concentration, and the flow rate is set.

Moreover, it necessary, for the constitution as shown by a broken line, the discharge port 319 for nitrogen gas supply is similarly disposed in the vicinity of the preheater 307 of the preliminary heating step, and the oxygen concentration of the atmosphere in the vicinity of the preheater 307 may also be measured by the oxygen concentration meter. In this constitution, the oxygen concentrations of the preliminary heating step and soldering step can also separately be adjusted/controlled.

The soldering operation is performed while the printed wiring board 301 is conveyed by the conveyors 302, 303. Specifically, the printed wiring board 301 supplied through the conveying-in port 305 is conveyed in the arrow A direction. The board is conveyed in order of the preliminary heating step→soldering step, the molten solder 309 is supplied to the portion to be soldered of the printed wiring board 301 by the jet flows 312, 315 in the soldering step to solder the portion, and the completely soldered printed wiring board 301 is conveyed out via the conveying-out port 306.

The flow soldering operation is performed in the preliminary heating step, while the temperature of the portion to be soldered of the printed wiring board 301 indicates a predetermined target value in a range of 80° C. to 150° C. The operation is performed in the soldering step, while the temperature of the tin-9 zinc solder indicates the predetermined target value in a range of 220° C. to 230° C.

It is to be noted that, as disclosed in Japanese Patent Application Laid-Open No. 2001-293559, the oxygen concentration of the preliminary heating step is controlled at 1000 ppm or less, the oxygen concentration of the soldering step is controlled at 500 ppm or less, and the printed wiring board 301 by the tin-9 zinc solder can be flow-soldered with satisfactory wettability.

[Second Embodiment]

As clarified by the present inventors, when the soldering terminal of the electronic component is coated with the tin-lead solder, and when the reflow soldering is performed with the tin-silver-copper based lead-free solder, a micro ternary eutectic alloy of tin-silver-lead having a melting point of 178° C. is formed in a fillet interface of the land of the portion to be soldered. This causes the fillet peel in the subsequently performed flow soldering.

Then, the present inventors further confirmed this fact in the actual soldering operation of the printed wiring board.

FIGS. 15A through 15C show tables and a diagram showing a result of confirmation of occurrence conditions of the fillet peel, and FIG. 15A shows types of the solder, types of plating of the electronic component, and the result of analysis of the soldering procedure stage in which the peel occurs. FIG. 15B shows a result of measurement of temperature of the portion to be soldered completely soldered by reflow soldering during the flow soldering. FIG. 15C is a diagram showing that a heat insulation tape for inhibiting heat conduction is attached to a surface to be flow-soldered opposite to a surface reflow-soldered with QFP IC before performing the flow soldering.

To perform the analysis, in the reflow soldering operation, the temperature of the soldering terminal (lead terminal) of the portion to be soldered or the solder was set to 230° C., and in the flow soldering operation, the temperature of the solder was controlled to be 250° C. Moreover, in FIG. 15A, mark ○ indicates that the fillet peel does not occur and mark X indicates that the fillet peel occurs.

As shown in FIG. 15A, even in any one of the tin-37 lead solder, tin-3 silver-0.5 copper solder, and tin-3.5 silver-0.75 copper solder, regardless of the types of plating of the soldering terminal of the component, that is, the tin-lead solder plating or tin-bismuth solder plating, it is found out that the fillet peel does not occur with only the reflow soldering operation of the first surface.

However, when the second surface is successively flow-soldered, it is seen that the fillet peel occurs only with the use of the tin-3 silver-0.5 copper solder and tin-3.5 silver-0.75 copper solder during the reflow soldering of the first surface and with the component plated with the tin-zinc solder. It is to be noted that the solder used in the flow soldering has substantially the same composition as that of the solder used in the reflow soldering.

Further, as shown in FIG. 15C, it is seen that a heat insulation tape 40 for suppressing temperature rise of the soldering terminal of QFP IC 16 (240 pin QFP IC) is attached and the fillet peel does not occur even by the flow soldering.

As shown in FIG. 15B, the temperature of the reflow-soldered portion during the flow soldering is 182° C. in a usual soldered state without the heat insulation tape 40, and rises to 122° C., when the heat insulation tape 40 is attached. In this event, the temperatures of the first surface of the printed wiring board 10, namely, the surface of the reflow soldering surface were 201° C. and 133° C.

As confirmed from these analysis results, only in the soldered portion in which the electronic component 12 including the soldering terminal plated with the tin-zinc solder is reflow-soldered with the tin-silver-copper based lead-free solder, the fillet peel occurs by the subsequently performed flow soldering. During the flow soldering, the temperature of the soldering portion rises to 182° C. which exceeds the melting point of 178° C. of the tin-silver-lead ternary eutectic alloy, and this can be specified as the cause.

Next, the presence/absence of the fillet peel was checked by the use of the soldering method of the present invention. FIGS. 16A and 16B show tables showing the result of the check, and FIG. 16A is a table collectively showing the types of the solder for performing the reflow soldering, types of plating of the electronic component, and temperature of the tin-9 zinc solder for use in the flow soldering which are factors, and the presence/absence of the fillet peel. FIG. 16B is a table comparing the temperatures of portions during the flow soldering in the type of the solder and appropriate solder temperatures for use during the soldering.

Specifically, as shown in FIG. 16A, similarly as in the above-described example, the tin-3 silver-0.5 copper solder and tin-3.5 silver-0.75 copper solder are used in the solder during the reflow soldering, the tin-9 zinc solder is used in the solder for performing the flow soldering, and the temperatures are 220° C. and 230° C. This case was studied. As a result, in any case, the fillet peel did not occur.

Figure 12:
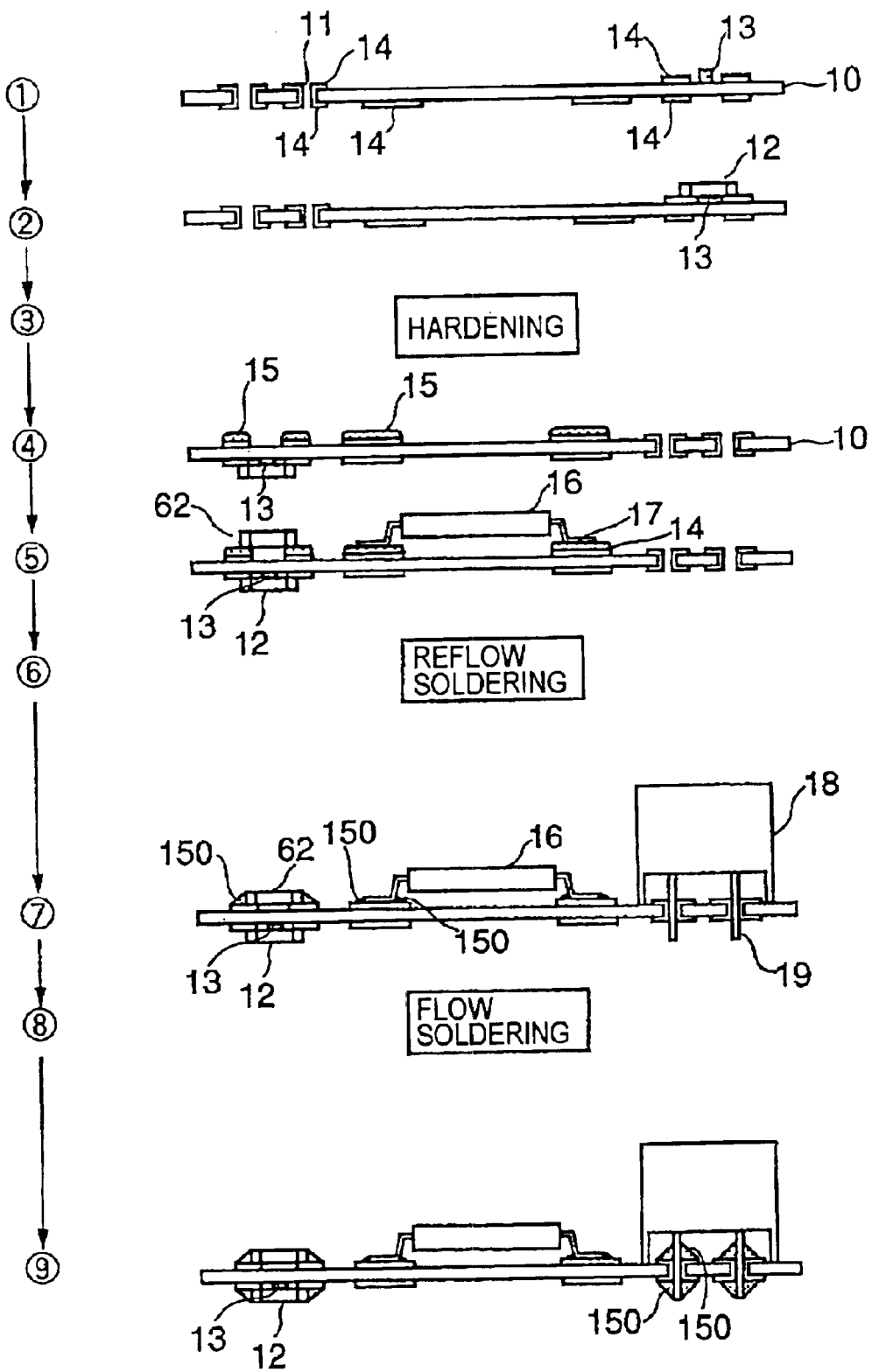
FIG. 12 is a diagram showing a soldering procedure which realizes the soldering method of the present invention.

Naturally, the tin-9 zinc solder sufficiently wets up also in the plated through hole, and also sufficiently wet-spreads over the land (state shown in step (9) of FIG. 12). Moreover, when the printed wiring board is HAL-treated by the tin-zinc solder, or when the acrylic acid adduct of rosin and the activator including the sarcosine framework are used in the flux composition, even with an extremely low temperature of the solder of 220° C. to 230° C., a wetting-up speed of the tin-9 zinc solder is very high, and the fillet is extremely securely formed.

On the other hand, as shown in FIG. 16B, the temperature of the lead terminal portion of the 240 pin QFP IC in the flow soldering, that is, the soldering terminal is 151° C., when the temperature of the tin-9 zinc solder is 220° C. The terminal temperature is 160° C., when the temperature of the tin-9 zinc solder is 230° C. It is found out that the temperature is far lower than the melting point of the tin-silver-lead ternary eutectic alloy which is 178° C. In other words, when the temperature of the soldering for the flow soldering can be reduced, the temperature rise of the reflow-soldered portion is also reduced.

Additionally, in the flow soldering using the tin-37 lead solder, tin-3 silver-0.5 copper solder, and tin-3.5 silver-0.75 copper solder at an appropriate flow soldering temperature of 250° C., the terminal temperature is 182° C., as described above.

Specifically, with the flow soldering using the tin-9 zinc solder at a controlled temperature of 220° C. to 230° C., the micro tin-silver-lead ternary eutectic alloy present in the interface of the reflow-soldered portion is stopped from being molten, and the fillet peel can securely be prevented.

It is to be noted that the printed wiring board used in the experiment as shown in FIGS. 15A through 15C and 16 is FR-4 material using a base material of most generally used 1.6 mm thick glass epoxy having ASTM/NEMA standard.

[Third Embodiment]

The flow soldering method of a third embodiment of the present invention can be performed as follows.

(1) Constitution of Flow Soldering Apparatus

Figure 18:
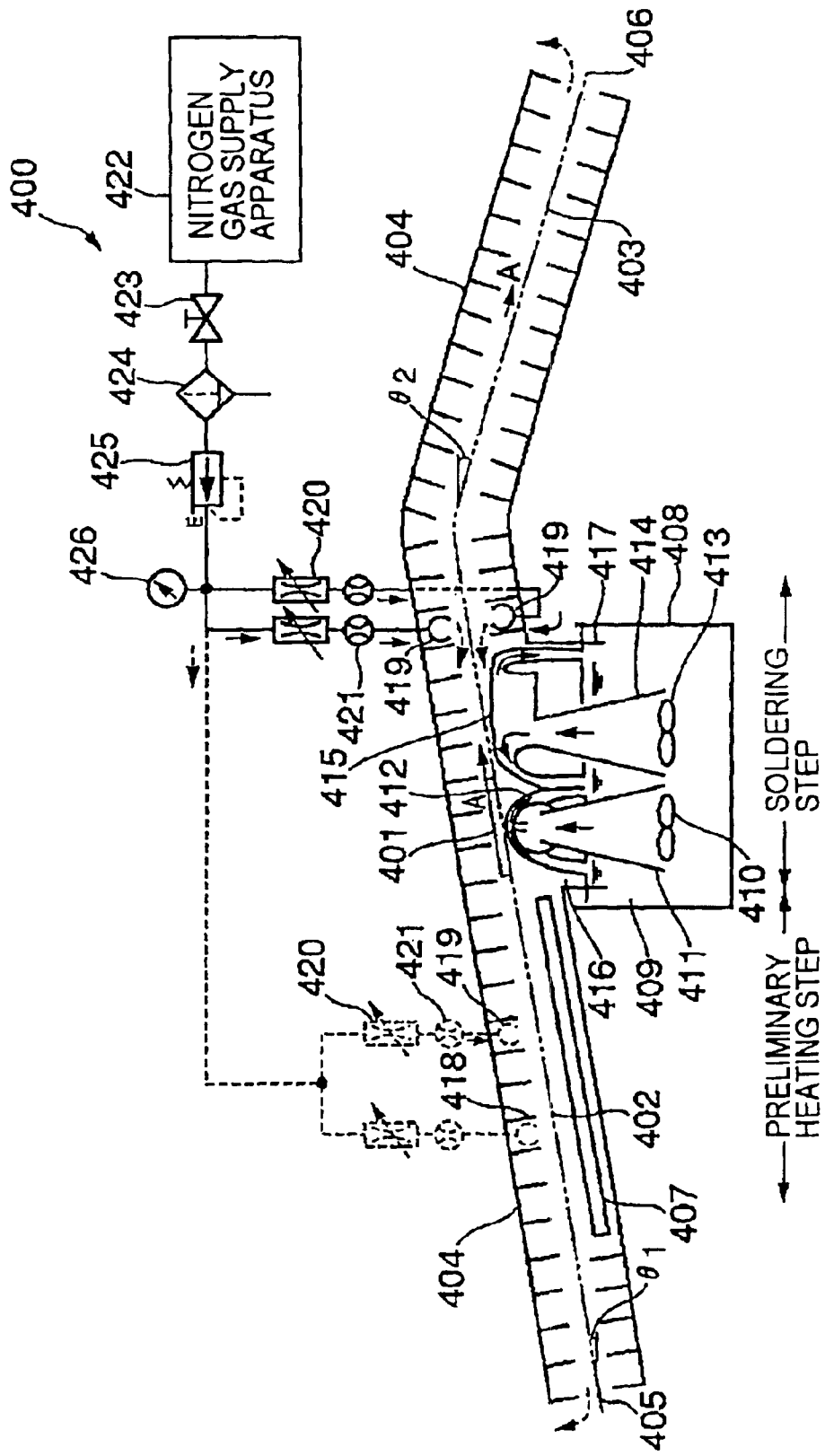
FIG. 18 is a longitudinal sectional view showing one example of the flow soldering apparatus.

At first, a constitution example of the flow soldering apparatus in which the flow soldering method of the present invention can be performed will be described. FIG. 18 is a longitudinal sectional view showing one example of the flow soldering apparatus, and the nitrogen gas supply system is shown in a symbol drawing. Specifically, the flow soldering apparatus is constituted to perform the soldering operation in the atmosphere of the inactive gas having the low oxygen concentration, namely, nitrogen gas. It is to be noted that the flow soldering apparatus of FIG. 18 has a constitution similar to that of the flow soldering apparatus shown in FIGS. 8A and 8B and 14.

The conveyor for conveying the work to be soldered, that is, printed wiring board 401 is constituted of a first conveyor 402 for elevation-angle conveyance (elevation angle θ1) and second conveyor 403 for depression-angle conveyance (depression angle θ2). A tunnel-shaped chamber 404 is disposed to cover these conveyors.

As shown in FIG. 18, the longitudinal section of the tunnel-shaped chamber 404 has an inverted V shape, and a conveying-in port 405 and conveying-out port 406 are constituted to have the same height from the horizontal plane. Thereby, it is easy to retain the atmosphere in the chamber 404 at a temperature higher than that of the atmosphere outside the chamber 404, and the atmosphere in which components (e.g., oxygen concentration) are stable can be formed.

The first and second conveyors 402, 403 include holding claws for holding opposite side ends of the printed wiring board 401, and each conveyor includes two conveyor frames disposed on opposite side ends and in parallel with each other. Moreover, a preheater 407 constituting the preliminary heating step of the printed wiring board 401, and a solder tank 408 constituting a soldering step are disposed along the first conveyor 402 in the tunnel-shaped chamber 404. Herein, the shown arrow A indicates the conveyance direction of the printed wiring board 401.

The solder tank 408 of the soldering step contains a tin-9 zinc solder 409, and the solder 409 is heated by the heater, temperature sensor, and temperature control apparatus (not shown) and has a molten state. The temperature is controlled at the predetermined temperature. This molten solder 409 is sent to a first spray nozzle 411 by a first pump 410 to form a first jet flow 412. A second pump 413 sends the solder to a second spray nozzle 414 to form a second jet flow 415.

Subsequently, these jet flows 412, 415 are brought into contact with the lower surface of the printed wiring board 401, namely, the surface to be flow-soldered of the lower surface of the printed wiring board 10 on which the portion to be soldered exists including the land 14 and through hole 11, and the soldering and lead terminals of the electronic component 12 as shown in the step (7) of FIG. 12. Thereby, the molten solder 409 is supplied to the portion to be soldered to solder the portion.

Moreover, the preheater 407 is disposed in the tunnel-shaped chamber 404. However, the solder tank 408 is constituted such that an opening 416 is disposed in the tunnel-shaped chamber 404 and the first and second jet flows 412 and 415 are positioned in the tunnel-shaped chamber 404 through the opening 416. With this structure, a skirt 417 is disposed in the opening 416. The skirt 417 is immersed in the molten solder 409 in the solder tank 408 to realize the complete sealing.

Further, a large number of plate members, that is, inhibit plates 418 are disposed along the longitudinal direction of the tunnel, that is, the conveyance direction of the conveyors 402, 403 in the tunnel-shaped chamber 404. The plates form the labyrinth seal, and are constituted to prevent an unnecessary atmospheric flow from being generated in the tunnel-shaped chamber 404.

Discharge ports 419 for supplying nitrogen gas which is the inactive gas into the tunnel-shaped chamber 404 are disposed among the inhibit plates 418 disposed after the solder tank 408 as viewed from the conveyance direction, and the targeted nitrogen gas supply flow rate can be adjusted by flow rate adjustment valves 420 and flow rate meters 421. The nitrogen gas is supplied from a nitrogen gas supply apparatus 422 of a bomb or PSA type, and supplied to the flow rate adjustment valves 420 via an open/close valve 423, filter 424 for removing impurities, and pressure control valve 425 for adjusting a supply pressure to the target. A pressure meter 426 is disposed to monitor the pressure.

For the nitrogen gas supply flow rate, the oxygen concentration in the tunnel-shaped chamber 404 is measured by the oxygen concentration meter (not shown), for example, the atmosphere of the soldering step as the contact region of the printed wiring board 401 with the jet flows 412, 415 of the molten solder 409 is sampled, and the rate is measured. The flow rate adjustment valves 420 are adjusted so as to obtain the target oxygen concentration, and the flow rate is set.

If necessary, for the constitution as shown by a broken line, the discharge port 419 for nitrogen gas supply is similarly disposed in the vicinity of the preheater 407 of the preliminary heating step, and the oxygen concentration of the atmosphere in the vicinity of the preheater 407 may also be measured by the oxygen concentration meter. In this constitution, the oxygen concentrations of the preliminary heating step and soldering step can also separately be adjusted/controlled.

The soldering operation is performed while the printed wiring board 401 is conveyed by the conveyors 402, 403. Specifically, the printed wiring board 401 supplied through the conveying-in port 405 is conveyed in the arrow A direction. The board is conveyed in order of the preliminary heating step→soldering step, the molten solder 409 is supplied to the portion to be soldered of the printed wiring board 401 by the jet flows 412, 415 in the soldering step to solder the portion, and the completely soldered printed wiring board 401 is conveyed out via the conveying-out port 406.

The flow soldering operation is performed in the preliminary heating step, while the temperature of the portion to be soldered of the printed wiring board 401 indicates the predetermined target value in a range of 80° C. to 150° C. The operation is performed in the soldering step, while the temperature of the tin-9 zinc solder indicates the predetermined target value in a range of 220° C. to 230° C.

In one example, after the temperature of the surface to be soldered of the printed wiring board is preliminarily heated at about 120° C., the surface is brought into contact with the jet flow of the tin-9 zinc solder at 220° C. to perform the flow soldering.

(2) Soldering Procedure

FIG. 17 is an explanatory view of a procedure for realizing the method of flow soldering of the present invention, and FIGS. 17A to 17E are longitudinal sectional views showing the states of the printed wiring board and mounted electronic component for each procedure. Herein, the flow soldering apparatus of the above (1) is used in a step of FIG. 17E.

(Procedure 1)

Figure 17A:
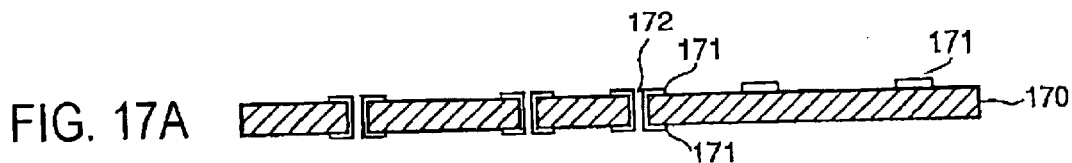
FIGS. 17A to 17E are explanatory views of a procedure for realizing the method of flow soldering of the present invention.
Figure 17B:
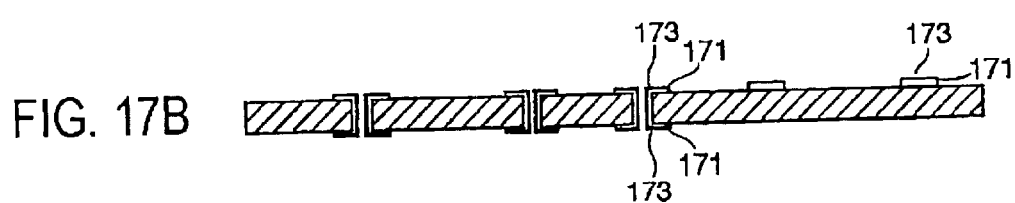

With respect to a printed wiring board 170 including copper lands 171 and copper through hole 172 constituting the portion to be soldered as shown in FIG. 17A, known HAL treatment is performed using the tin-silver-copper based solder (e.g., tin-3.5 silver-0.75 copper solder, tin-3 silver-0.5 copper solder), tin-silver based solder (e.g., tin-3.5 silver solder), tin-copper based solder (e.g., tin-0.75 copper solder), or tin (100 tin). A layer 173 of the above-described solder or tin is formed on the surfaces of the copper lands 171 and copper through hole 172 (copper plated through hole) (FIG. 17B). The layer of the solder or tin may also be used by other known methods such as plating.

In this case, a tin-rich lead-free solder is used in the solder. Specifically, the lead-free solder in which a content of tin is 90% or more is preferable. As described later in examples, the wet-spread of the tin-zinc solder over the lands 171 or the wet-up of the tin-zinc solder in the plated through hole 172 are improved in satisfactory states.

In this event, the tin-rich lead-free solder is limited to a solder containing no bismuth. When bismuth is contained, the solder of the portion to be soldered is embrittled after the soldering. Original characteristics of the tin-zinc solder having high tenacity are lost and connection strength of the soldered portion becomes weak against cycle stress.

(Procedure 2)

Figure 17C:
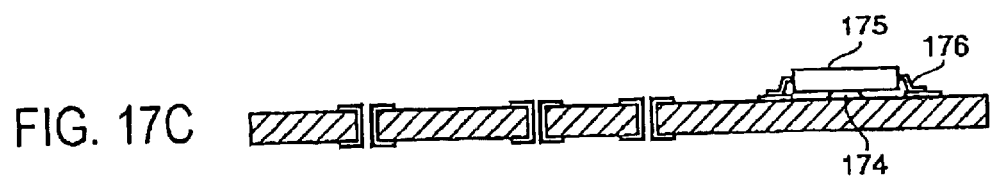
Figure 17D:
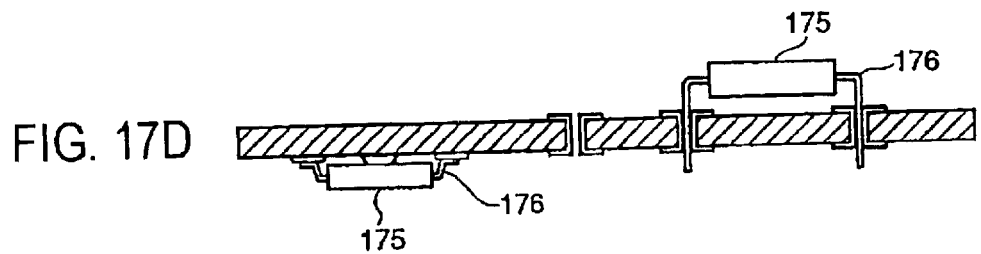
Figure 17E:
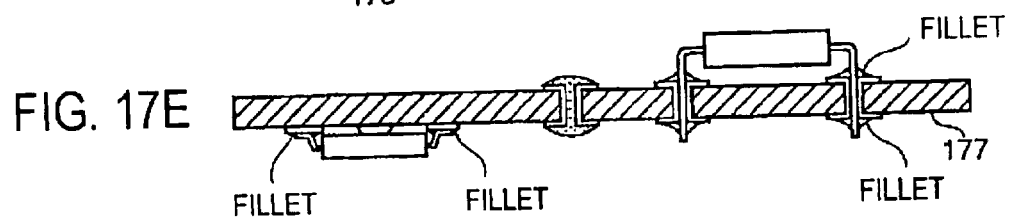

An electronic component 175 (e.g., SOP IC) is fixed and mounted onto the printed wiring board 170 on which the layer of the solder or tin is disposed as shown in FIG. 17B by an adhesive 174, as shown in FIG. 17C. Moreover, for the electronic component 175 including an insertion type lead terminal 176, as shown in FIG. 17D, after the printed wiring board 170 is reversed as shown in FIG. 17D, a lead terminal 176 of the corresponding electronic component 175 (e.g., DIP IC, SIP IC, ZIP IC) is inserted in the through hole 172 to mount the component. Naturally, the electronic component 175 mounted in FIG. 17C or 17D is one example.

The terminal subjected to a lead-free metal plating or coating treatment is used in the soldering terminal of the electronic component 175 or soldering lead terminal 176. A metal for use in the plating or coating treatment differs with the type or manufacturer of the electronic component 175. For passive components such as a resistance and capacitor, the solder similar to that for use in the soldering is often used. However, wetting in die-bonding the lead frame is also considered in semiconductor components such as IC, and palladium or palladium alloy is used as one example.

(Procedure 3)

When the mounting of the electronic component 175 onto the printed wiring board 170 is completed in the procedure 2, the printed wiring board 170 is soldered by the flow soldering apparatus described in the above (1). Specifically, the surface to be soldered shown in FIG. 17E (shown lower surface) is brought in contact with the jet flow of the tin-zinc solder (e.g., tin-9 zinc solder), the tin-zinc solder is supplied to wet a portion to be soldered 177, and the tin-zinc solder wets up in the plated through hole 172.

In this case, the layer of the tin-rich lead-free solder or tin is formed on the surfaces of the land and plated through hole of the printed wiring board 170 by the procedure 1, and therefore the wet-spread of the tin-zinc solder in the land 171 and the wet-up in the plated through hole 172 are improved.

Also when the palladium or palladium alloy layer is disposed on the surface of the soldering terminal of the electronic component 175 mounted on the land 171 or the surface of the soldering lead terminal 176 of the electronic component 175 inserted in the through hole 172, the tin-zinc solder well wets-spreads over the palladium or palladium alloy layer. Therefore, superior soldering property is obtained. On the other hand, the superior wet-spread or wet-up of the tin-zinc solder cannot be obtained with another lead-free solder.

In the meantime, during the flow soldering of the printed wiring board, the post flux is usually applied before the preliminary heating step to prevent oxidation and improve wettability. However, when the flux containing acrylic acid adduct of rosin and the activator including the sarcosine framework is used, the wettability is persistently enhanced in contact with the jet flow. More satisfactory wettability is obtained particularly in the tin-zinc solder.

[Third Embodiment]

(1) Evaluation of Soldering Property by Spread Ratio Method

A spread ratio test of the solder was performed in conformity to JIS-Z-3184, and the soldering property was evaluated.

First, a phosphor deoxidized copper plate (JIS C-2100 50×50×0.3 mm) was plated (leveler treatment) with molten tin (100 tin), tin-0.75 copper solder, tin-3 silver-0.5 copper solder, tin-3.5 silver solder, and tin-3.5 silver-0.75 copper solder to prepare test pieces three for each. Three test pieces of the phosphor deoxidized copper plate (100 copper) which were not plated/treated were prepared.

Next, a tin-9 zinc solder paste was printed on each test piece. Subsequently, the test piece was introduced into a reflow furnace in which nitrogen atmosphere having oxygen concentration of 500 ppm was formed, and soldered on heating conditions that peak temperature was 220° C. and holding time was 60 seconds at 200° C. or more.

Then, each soldered test piece was cooled at room temperature. Thereafter, the flux remaining on the surface of each test piece was cleaned/removed with alcohol. Successively, the height of the solder on each test piece was measured, and each spread ratio S (%) was obtained in the following equation (1).

$$S=(D-H)/D\times 100(\%) \tag{1}$$

Herein, H denotes a height (mm) of the spread solder, and D denotes a diameter (mm) of a volume of the printed solder which is regarded as a ball.

$$D=1.24\ V^{1/3} \tag{2}$$

$$V=\text{mass/specific gravity of printed solder} \tag{3}$$

Figure 19:
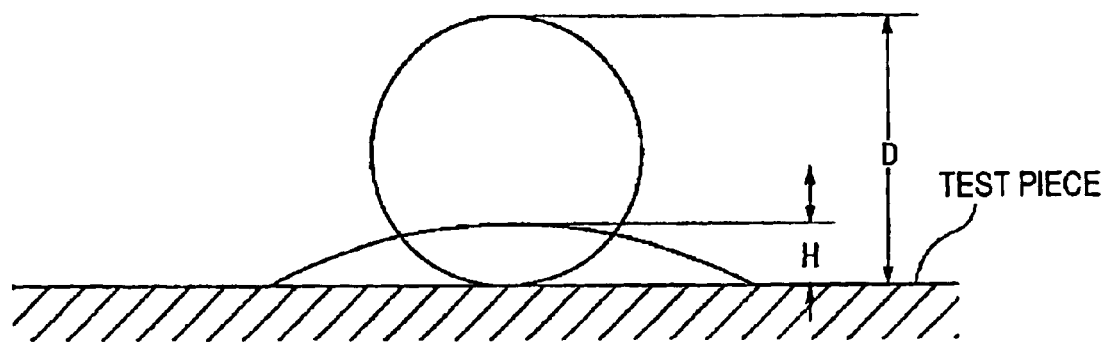
FIG. 19 is an explanatory view of a spread solder height (H) and a diameter (D) of a volume of printed solder which is regarded as a ball in a spread ratio test of the solder in conformity to JIS-Z-3184.

Here, meanings of H and D are illustrated in FIG. 19.

Figures 20A, 20B:
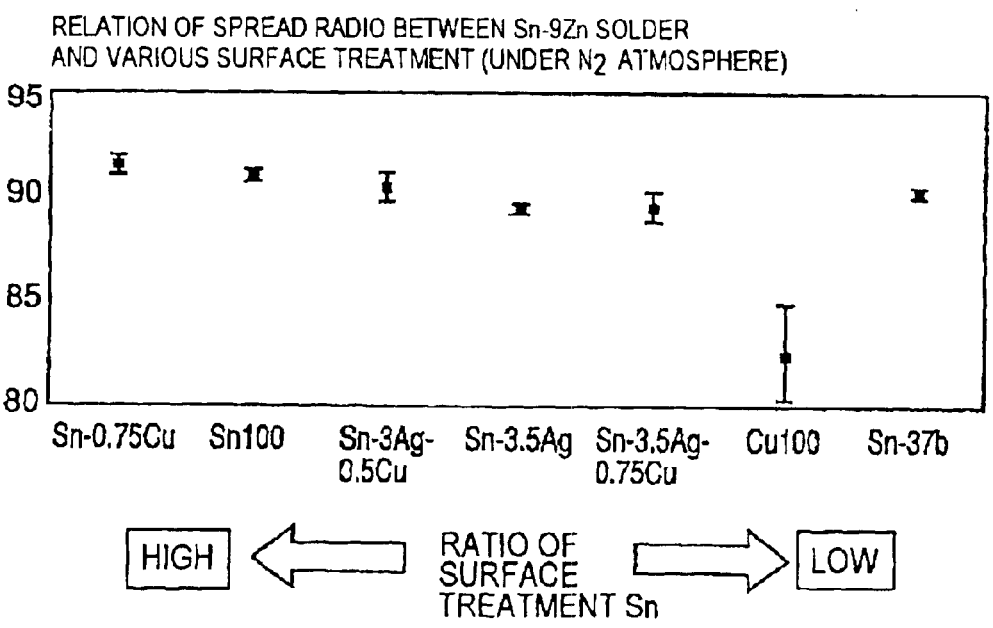
FIGS. 20A and 20B show a diagram and a graph, respectively, collectively showing spread ratio test results of the solder in conformity to JIS-Z-3184.

These measurement results are collectively shown in a table in a diagram/graph of FIGS. 20A and 20B, respectively. FIG. 20A is a diagram/table showing the spread state of the tin-zinc solder in photos and each center value of the spread ratio S (%). FIG. 20B is a diagram showing the spread ratio S (%) including a deviation. It is to be noted that each element is shown by an element symbol in FIGS. 20A and 20B.

Specifically, with 100 copper corresponding to the printed wiring board on which the copper land and through hole are formed, the wet-spread ratio of the tin-9 zinc solder is 82.3%. In contrast, when the molten plating treatment corresponding to the leveler treated printed wiring board is tin (100 tin), the ratio is 90.9%. The wet-spread ratio is 91.4% with the tin-0.75 copper solder, 90.3% with the tin-3 silver-0.5 copper, 89.4% with the tin-3.5 silver solder, and 89.3% with the tin-3.5 silver-0.75 copper solder.

It is seen from FIG. 20B that with more content of tin of the leveler treatment, the wet-spread of the tin-zinc solder is proportionally improved.

Further, it can be concluded from this diagram/table that the leveler treatment is performed by tin or the tin-rich solder containing a content of tin of 90 weight % or more, and the satisfactory wet-spread ratio of about 85% or more can be obtained.

(2) Evaluation by Flow Soldering

Next, the land to be soldered and plated through hole of the printed wiring board were variously leveler-treated, the printed wiring board on which the layer of the tin or tin-rich solder was formed was flow-soldered by the tin-9 zinc solder, and soldering property was evaluated. Upon the soldering, the temperature of the solder or jet flow is low at 220° C.

Figures 21A, 21B:
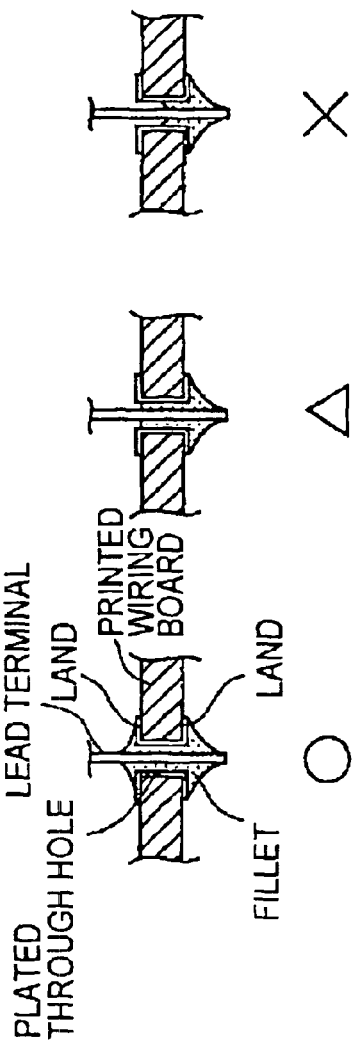
FIGS. 21A and 21B show a table and a diagram, respectively, showing the results of the flow soldering by the tin-zinc solder of the printed wiring board subjected to various leveler treatments.

FIGS. 21A and 21B show a table and a diagram, respectively, showing the results of the flow soldering by the tin-zinc solder of the printed wiring board subjected to various leveler treatments. FIG. 21A is a diagram (the element symbol is used to show each element) showing soldering results in a table. FIG. 21B is a vertical section of the portion to be soldered showing an evaluation standard of the soldering property. It is to be noted that the evaluation standard in FIG. 21B is shown for the lead terminal of the electronic component inserted in the plated through hole with most difficulty in the flow soldering.

Specifically, referring to FIGS. 21A and 21B, in the printed wiring board, a layer of tin (100 tin), tin-1.2 silver-0.75 copper solder, tin-3 silver-0.5 copper solder, tin-3.5 silver-0.75 copper solder, or tin-9 zinc solder is formed on the land to be soldered and plated through hole of the printed wiring board. Also in the printed wiring board, the copper land or through hole is plated with nickel and this foundation is, plated with gold. Moreover, the copper land or through hole is not treated in a copper printed wiring board. With respect to the respective boards, the soldering property by the tin-9 zinc solder is evaluated and the result is shown.

To perform this evaluation, the electronic component in which the layer of the tin-zinc solder is formed on the soldering lead terminal is inserted in the through hole and mounted. The electronic component is inserted in the through hole and mounted, in which soldering lead terminal is plated with nickel, this underlayer is plated with palladium, and the palladium layer is formed on the surface of the soldering lead terminal. Further, the used electronic component is DIP IC.

In this event, the electronic component including the soldering lead terminal with the layer of the tin-zinc solder formed thereon is inserted in the through hole and mounted and this is evaluated to compare this with a related-art example using lead.

Next, the evaluation standard shown in FIG. 21B will be described. As shown, "○" indicates a satisfactory soldered state in which the solder wets up in the through hole and the solder fillets are formed over the lands on the lower and upper surfaces of the printed wiring board. The solder fillet is formed on the land of the lower surface of the printed wiring board and the solder also wets up in the through hole. However, the solder cannot wet-spread over the upper land of the printed wiring board and the fillet is not formed. This state is indicated as the slightly insufficient soldered state by "Δ". The solder fillet is formed on the land of the lower surface of the printed wiring board, but the solder does not sufficiently wet up in the through hole. Therefore, the solder cannot wet-spread over the upper land of the printed wiring board and the fillet is not formed. This state is shown as the insufficient soldered state by "X".

From the evaluation result of FIG. 21A, the electronic component mounted on the printed wiring board and including the soldering lead terminal with the lead-free palladium layer formed thereon has an insufficient soldered state with the printed wiring board plated with nickel/gold or the printed wiring board which is not treated. However, in the printed wiring board in which the tin layer or the layer of the tin-rich solder is formed, satisfactory soldered state is obtained.

The electronic component (particularly, IC including the lead frame) including the palladium or palladium alloy layer formed on the surface of the soldering terminal or lead terminal is generally assumed to be inferior to that including the layer of the tin-lead solder in wettability to the lead-free solder. However, according to the flow soldering method of the present invention, the satisfactory soldered state can be obtained.

In the printed wiring board subjected to the nickel/gold plating treatment, superior wettability and soldering property are obtained, when the related-art layer of the tin-zinc solder is formed on the electronic component. However, it is seen that the insufficient soldered state is obtained with the palladium layer formed on the soldering lead terminal of the electronic component.

Further, the tin-zinc solder was raised at 230° C. and 250° C. to perform the flow soldering, but the similar evaluation result is obtained. A superiority difference by the temperature of the solder and jet flow was not recognized.

In this manner, the layer of the lead-free solder of tin (100 tin) or rich in tin (tin content of 90 weight % or more) is formed beforehand on the surfaces of the land to be soldered and plated through hole of the printed wiring board. The electronic component is mounted on the printed wiring board and flow-soldered by the tin-zinc solder, so that satisfactory soldering property is obtained.

Specifically, when the tin-zinc solder is used to perform the flow soldering, main factor of the printed wiring board concerning the wettability is controlled. Even with the use of the tin-zinc solder which has heretofore been evaluated as bad in the wettability and which has not been an object solder of the flow soldering, it is possible to stably produce printed wiring boards in mass with superior soldering quality.

Additionally, even with the solder having a low temperature of the solder and jet flow at 220° C., satisfactory wet-spread and wet-up are obtained in the land to be soldered and plated through hole. This temperature is much low as compared with the temperature (about 240° C. to 250° C.) during the flow soldering by the related-art tin-lead solder or temperature (about 250° C. to 255° C.) during the flow soldering by a high melting point lead-free solder.

As a result, heat stress imposed onto the electronic component is reduced during the soldering, and the life of the electronic component in which this heat stress is a factor is much longer than that of the related-art tin-lead solder or high-melting point lead-free solder. Only deterioration of the electronic component by another factor may be a problem.

Further, it is known that the tin-zinc solder has strong tenacity even as compared with any other lead-free solder, and has appropriate hardness and superior elongation characteristic. Therefore, it is possible to maintain the connection state to be tenacious against the cycle stress. Therefore, with the use in an apparatus (e.g., car) having much heat or acceleration cycle stress, trouble occurrence because of connection breakage (disconnection) of the portion to be soldered is extremely little, and outstanding reliability can be obtained.

(3) Flux which can Obtain Persistent Function

For the evaluation by the flow soldering, as usual, the post flux was sprayed/applied to the printed wiring board. In addition to gum rosin which is the related-art resin component of the post flux, the acrylic acid adduct of rosin having high heat resistance is selectively used in the flux. Further, from a viewpoint of securing persistent wettability enhancement, the activator including the sarcosine framework is selectively used in the activator to be blended. The acrylic acid adduct of rosin includes an addition reactant of acrylic acid and rosin or rosin derivative further subjected to hydrogenation reaction. Examples of rosin include gum rosin, wood rosin, and tall oil rosin containing resin acids such as abietic acid, palustric acid, neoabietic acid, pimaric acid, isopimaric acid, and dehydroabietic acid as main components. Moreover, examples of the activator including the sarcosine framework include oleyl sarcosine, lauroyl sarcosine, and palm oil fatty acid sarcosine.

For the evaluation by the flow soldering, as usual, the post flux was sprayed/applied to the printed wiring board. In addition to gum rosin which is the related-art resin component of the post flux, the acrylic acid adduct of rosin having high heat resistance is selectively used in the flux. Further, from a viewpoint of securing persistent wettability enhancement, the activator including the sarcosine framework is selectively used in the activator to be blended. The acrylic acid adduct of rosin includes an addition reactant of acrylic acid and rosin or rosin derivative further subjected to hydrogenation reaction. Examples of rosin include gum rosin, wood rosin, and tall oil rosin containing resin acids such as abietic acid, parastrin acid, neoabietic acid, pimaric acid, isopimaric acid, and dehydroabietic acid as main components. Moreover, examples of the activator including the sarcosine framework include oleyl sarcosine, lauroyl sarcosine, and palm oil fatty acid sarcosine, In addition to the above-described specific constituting components, various components for use in the conventional flux can also be used such as resin, activator, solvent, antioxidant, delusterant, and other additives.

Examples of the resin component for use in the conventional flux include various rosin derivatives such as gum rosin, polymerized rosin, deproportionated rosin, and hydrogenated rosin, and synthetic resins such as a polyamide resin and terpene resin.

Moreover, examples of the activator for use in the conventional flux include hydrohalide of amine, organic acids, organic amine, and organic halide. Concrete examples of hydrohalide of amine include diethylamine hydrochloride, and cyclohexylamine hydrobromide. Concrete examples of organic acids include adipic acid, stearic acid, and benzoic acid. Concrete examples of organic amines include hexylamine, dibutylamine, and triethylamine. Concrete examples of organic halides include 2,3-dibromo-1-propanol, and 2,3-dibromo-2-butene-1,4-diol. Further, examples of the solvent include isopropyl alcohol, acetic ether, and toluene.

Moreover, antioxidant, delusterant, and other additives are not especially limited, and various known agents may appropriately be selected and used.

Next, the present invention will be described hereinafter in more detail in terms of examples of the flux. The liquid flux composition including Examples 5 to 8 and Comparative Examples 4 to 6 was prepared, and spray-applied to the printed wiring board on which the electronic component was mounted, and the component was soldered by the above-described flow soldering apparatus.

Figures 22A, 22B:
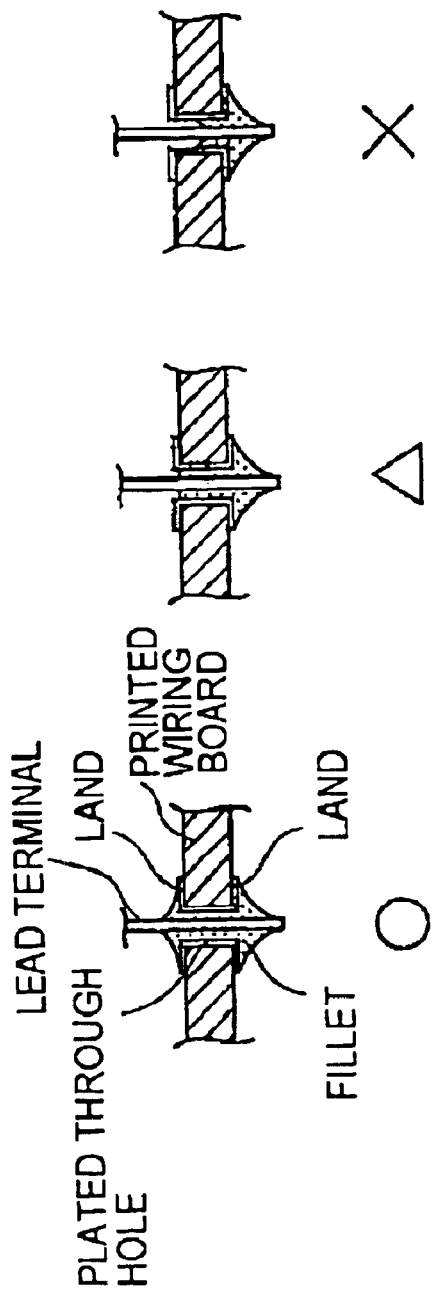
FIGS. 22A and 22B show a table and a diagram, respectively, showing soldering evaluation results using examples and comparative examples of the flux.

FIG. 22A is a diagram/table showing the evaluation results using examples. As shown in FIG. 22B, the evaluation results ○△X were evaluated by the same evaluation standard as that shown in FIG. 21B.

| (Example 5) | |
|---|---|
| Adipic acid | 1.0 wt % (weight %) |
| Dibutyl amine | 1.0 wt % |
| Cyclohexylamine hydrobromide | 0.2 wt % |
| Oleyl sarcosine | 1.0 wt % |
| Acrylic acid adduct of rosin | 7.0 wt % |
| Hydrogenerated rosin | 7.0 wt % |
| Isopropyl alcohol | 82.8 wt % |
| (Example 6) | |
| Sebacic acid | 1.0 wt % |
| 2,3-dibromo-1-propanol | 0.5 wt % |
| Diethylamine hydrochloride | 0.2 wt % |
| Lauroyl sarcosine | 1.0 wt % |
| Acrylic acid adduct of rosin | 10.0 wt % |

-continued

| | |
|---|---|
| Gum rosin | 5.0 wt % |
| Isopropyl alcohol | 82.3 wt % |
| (Example 7) | |
| Octyl acid | 1.0 wt % |
| Benzoic acid | 1.0 wt % |
| Diphenylguanidine hydrobromide | 0.2 wt % |
| Palm oil fatty acid sarcosine | 1.0 wt % |
| Acrylic acid adduct of rosin | 20.0 wt % |
| Isopropyl alcohol | 77.8 wt % |
| (Example 8) | |
| Glutaric acid | 1.0 wt % |
| 2,3-dibromo-1-propanol | 0.5 wt % |
| Cyclohexylamine hydrobromide | 0.2 wt % |
| Oleyl sarcosine | 1.0 wt % |
| Acrylic acid adduct of rosin | 7.0 wt % |
| Deproportionated rosin | 7.0 wt % |
| Isopropyl alcohol | 83.3 wt % |
| (Comparative Example 4) | |
| Adipic acid | 1.0 wt % |
| Dibutyl amine | 1.0 wt % |
| Cyclohexylamine hydrobromide | 0.2 wt % |
| Gum rosin | 15.0 wt % |
| Isopropyl alcohol | 82.8 wt % |
| (Comparative Example 5) | |
| Sebacic acid | 1.0 wt % |
| 2,3-dibromo-1-propanol | 0.5 wt % |
| Diethylamine hydrochloride | 0.2 wt % |
| Lauroyl sarcosine | 1.0 wt % |
| Gum rosin | 15.0 wt % |
| Isopropyl alcohol | 82.3 wt % |
| (Comparative Example 6) | |
| Octyl acid | 1.0 wt % |
| Benzoic acid | 1.0 wt % |
| Diphenylguanidine hydrobromide | 0.2 wt % |
| Acrylic acid adduct of rosin | 10.0 wt % |
| Hydrogenerated rosin | 10.0 wt % |
| Isopropyl alcohol | 77.8 wt % |

As shown in the evaluation results of FIGS. 22A and 22B, satisfactory soldering properties are obtained in Examples 5, 6, 7, 8.

In this manner, by the flux composition of the present embodiment which is superior in heat resistance and in which wettability enhancement is obtained, the function of the flux such as the enhancement of wettability in the contact of the printed wiring board with the jet flow of the tin-zinc solder is persistently obtained. When the tin-zinc solder is wet-spread over the land to be soldered, or wetted up in the plated through hole, preferable function is obtained.

According to the soldering method of the first aspect of the present invention, it is possible to perform soldering/mounting without generating the lift-off. To solder the electronic component including the palladium or palladium alloy layer on the soldering lead terminal onto the printed wiring board, it is possible to perform the printed wiring board which is superior in solder wettability and whose mechanical connection is tenacious and whose electric connection is satisfactory and which has high soldering reliability.

Moreover, according to the solder joint member of the first aspect of the present invention, it is possible to establish both high reliability characteristic of the so-called lead-free semiconductor component which uses the lead frame with the palladium or palladium alloy layer formed thereon and which does not use lead, and high reliability characteristic in the soldering/mounting of the semiconductor component onto the printed wiring board.

Thereby, in all steps from the packaging of the semiconductor component to the soldering/mounting of the semiconductor component onto the printed wiring board, the high reliability characteristic can be obtained. As a result, the electronic component extremely high in reliability can be obtained.

According to the second aspect of the present invention, the electronic component having a condition that the land peel occurs during the flow soldering or the lead-free solder (soldering terminal of the tin-lead solder plating and tin-silver-copper based lead-free solder) is used to reflow-solder the printed wiring board. Thereafter, the surface opposite to the reflow-soldered surface is flow-soldered using the tin-9 zinc solder in a controlled temperature range of 220° C. to 230° C. Thereby, it is possible to hold the temperature of the reflow-soldered portion at 178° C. or less which is the melting point of the tin-silver-lead ternary eutectic alloy, and the land peel is prevented from occurring during the flow soldering.

Moreover, since the solder does not contain bismuth, the soldering strength is tenacious and the soldering strong against the cycle stress can be performed.

Further, with the use of the printed wiring board HAL-treated by the tin-zinc solder, although the temperature of the tin-9 zinc solder for use in the flow soldering is low, the tin-9 zinc solder rapidly wet-spreads over the plated through hole and connected land, and the secure and satisfactory soldering can be performed even in the through hole.

Additionally, the flux well matched to the tin-zinc solder which is easily oxidized is used, and thereby the soldering can be performed with further superior solder wettability.

As a result, the land peel with the use of the lead-free solder is securely blocked, and it is possible to solder/mount the printed wiring board superior in soldering quality and reliability.

According to the flow soldering method of the third aspect of the present invention, in the flow soldering operation using the tin-zinc solder, major factors influencing the soldering quality are controlled. Particularly, the major factors in the printed wiring board are controlled. The satisfactory wet-spread and wet-up of the tin-zinc solder can be obtained. To solder/mount a large number of various electronic components onto the printed wiring board using the tin-zinc solder, each portion to be soldered can uniformly and steadily be soldered in the superior soldered state.

Additionally, it is possible to perform the flow soldering with the solder having low temperature at 220° C., and it is possible to lengthen the life of the electronic component mounted on the printed wiring board and the life of the electronic apparatus on which the printed wiring board is mounted.

Therefore, it is possible to realize the electronic apparatus which is strong against the cycle stress and which has long life, that is, the high-reliability electronic apparatus. Further, since zinc is inexpensive, the apparatus can be manufactured at a cost lower than that of another lead-free solder.

While the present invention has thus far been disclosed in conjunction with several embodiments thereof, it will be readily possible for those skilled in the art to put the present invention into practice in various other manners.

What is claimed is:

1. A method for soldering an electronic component including a palladium or palladium alloy layer formed on a surface of the electronic component and also including a soldering lead terminal onto a printed wiring board including a soldering land and plated through hole, comprising the steps of:

forming a solder layer containing tin and zinc as main components on surfaces of the land and the through hole by a HAL treatment;

inserting and mounting the lead terminal in the through hole; and supplying the solder to the land and through hole by bringing the printed wiring board into contact with a jet flow of a solder containing tin and zinc as main components; and wherein a flux for use in soldering the lead terminal to the solder contains an acrylic acid adduct of rosin and an activator including a sarcosine framework.

2. The method according to claim 1, wherein:

the solder allows to wet the lead terminal while the solder wets up to reach an upper surface of the land via the through hole by bringing the printed wiring board in contact with the jet flow of the solder.

3. A method for soldering an electronic component including a soldering lead plated terminal onto a printed wiring board having a soldered through hole, comprising the steps of:

forming a solder layer containing tin and zinc as main components on a surface of the through hole by a HAL treatment;

inserting and mounting the lead terminal in the through hole;

bringing the printed wiring board into contact with a jet flow of a solder containing tin and zinc as main components, and supplying the solder to the through hole so as to reduce or prevent lift-off; and wherein a flux for use in soldering the lead terminal to the solder contains an acrylic acid adduct of rosin and an activator including a sarcosine framework.

4. The method according to claim 3, wherein:

the solder allows to wet the lead terminal while the solder wets up via the through hole by bringing the printed wiring board in contact with the jet flow of the solder.

5. A flow soldering method for bringing a printed wiring board on which an electronic component is mounted into contact with a jet flow of a solder containing tin and zinc as main components to perform soldering, comprising the steps of:

forming a layer of a solder rich in tin not containing bismuth and lead and containing tin, silver, and copper as main components, a solder containing tin and silver as the main components, or a solder containing tin and copper as the main components, content of tin being 90 weight % or more, or a layer of tin on an surface of a land to be soldered and plated through hole of the printed wiring board beforehand;

mounting the electronic component; and bringing the printed wiring board into contact with the jet flow of the solder containing tin and zinc as the main components to solder the board; and wherein a flux for use in the flow soldering contains an acrylic acid adduct of rosin and an activator including a sarcosine framework.

6. The flow soldering method according to claim 5, wherein:

a palladium or palladium alloy layer is formed on a surface of a soldering terminal of the electronic component to be mounted on the printed wiring board.

7. The flow soldering method according to claim 5, wherein:

the electronic component mounted on the printed wiring board includes a lead terminal, a palladium or palladium alloy layer is formed on the surface of the lead terminal, and the lead terminal is inserted and mounted in the plated through hole.

8. The flow soldering method according to claim 5, wherein:

temperature of the jet flow of the solder containing tin and zinc as the main components falls within a range of 220° C. to 250° C.

* * * * *